(12) United States Patent
Milshtein et al.

(10) Patent No.: US 6,531,897 B1
(45) Date of Patent: Mar. 11, 2003

(54) GLOBAL CLOCK SELF-TIMED CIRCUIT WITH SELF-TERMINATING PRECHARGE FOR HIGH FREQUENCY APPLICATIONS

(75) Inventors: Mark S. Milshtein, Portland, OR (US); Milo D. Sprague, Hudson, MA (US); Terry I. Chappell; Thomas D. Fletcher, both of Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/608,389

(22) Filed: Jun. 30, 2000

(51) Int. Cl.7 .............................................. H03K 19/096
(52) U.S. Cl. .............................. 326/95; 326/98; 326/121
(58) Field of Search .......................... 326/93–98, 112, 326/119, 121

(56) References Cited

U.S. PATENT DOCUMENTS

| | | |
|---|---|---|
| 5,226,011 A | 7/1993 | Yanagisawa |
| 5,453,708 A | 9/1995 | Gupta et al. |
| 5,467,037 A | 11/1995 | Kumar et al. |
| 5,517,136 A | 5/1996 | Harris et al. |
| 5,535,343 A | 7/1996 | Verseput |
| 5,708,374 A * | 1/1998 | Durham et al. ............ 326/93 |
| 5,721,875 A | 2/1998 | Fletcher |
| 5,764,084 A * | 6/1998 | Lev ........................... 326/98 |
| 5,796,282 A | 8/1998 | Sprague et al. |
| 5,828,234 A | 10/1998 | Sprague |
| 5,831,932 A | 11/1998 | Merritt et al. |
| 5,880,608 A | 3/1999 | Mehta et al. |
| 5,892,372 A | 4/1999 | Ciraula et al. |
| 5,942,917 A | 8/1999 | Chappell et al. |
| 5,952,859 A | 9/1999 | Kim et al. |
| 5,973,514 A * | 10/1999 | Kuo et al. .................... 326/98 |
| 5,986,475 A | 11/1999 | Kim et al. |
| 6,011,410 A | 1/2000 | Kim et al. |
| 6,023,182 A | 2/2000 | Milshtein et al. |
| 6,040,716 A | 3/2000 | Bosshart |
| 6,094,071 A | 7/2000 | Ciraula et al. |
| 6,172,530 B1 * | 1/2001 | Bull et al. .................. 326/105 |
| 6,201,415 B1 | 3/2001 | Manglore |
| 6,201,431 B1 * | 3/2001 | Allen et al. .................. 326/21 |
| 6,204,714 B1 | 3/2001 | Milshtein et al. |
| 6,239,621 B1 | 5/2001 | Milshtein et al. |
| 6,242,958 B1 | 6/2001 | Fletcher |
| 6,275,069 B1 | 8/2001 | Chung et al. |
| 6,320,441 B1 | 11/2001 | Fletcher et al. |
| 6,331,793 B1 | 12/2001 | Fletcher et al. |

OTHER PUBLICATIONS

Alisa Scherer et al., An Out-of Order Three-Way Superscalar Multimedia Floating-Point Unit 1999, pp. 94–95,449, Advanced Micro Devices, Sunnyvale, CA.

* cited by examiner

Primary Examiner—Michael Tokar
Assistant Examiner—Don Phu Le
(74) Attorney, Agent, or Firm—Cynthia T. Faatz

(57) ABSTRACT

A global clock self-timed circuit initiates a precharge pulse in response to which a domino node is precharged. A self-terminating precharge circuit coupled to the global clock self-timed circuit and the domino node terminates the precharge pulse after the domino node has been precharged.

27 Claims, 24 Drawing Sheets

GLOBAL CLOCK SELF-TIMED CIRCUIT WITH SELF-TERMINATING PRECHARGE FOR HIGH FREQUENCY APPLICATIONS

CROSS-REFERENCE TO RELATED APPLICATIONS

This application is related to copending U.S. patent applications Ser. No. 09/607,897, entitled, "Pulsed Circuit Topology to Perform a Memory Array Write Operation," Ser. No. 09/608,638, entitled, "Reset First Latching Mechanism for Pulsed Circuit Topologies," and Ser. No. 09/607,857, entitled, "Pulsed Circuit Topology Including a Pulsed, Domino Flip-Flop," each of which is concurrently filed herewith.

BACKGROUND

1. Field

An embodiment of the present invention relates to the field of high frequency integrated circuits and, more particularly, to high frequency integrated circuits that include domino logic.

2. Discussion of Related Art

Advances in semiconductor manufacturing technologies have enabled circuit designers to continue to integrate more transistors on a single die. At the same time, computer architecture, and more specifically, processor architecture, continues to focus on shorter and shorter cycle times.

Domino logic is frequently used in an effort to reduce power, die area and output capacitance as compared to static full complementary metal oxide semiconductor (CMOS) logic. The reduction in parasitic capacitance provided by domino CMOS logic permits higher speed and lower power operation.

As clock speeds continue to increase (and thus, cycle times continue to decrease) and/or where certain parts of a chip operate at a much higher frequency, limitations of conventional logic circuits, including conventional domino logic circuits, may prevent such circuits from operating properly at the higher clock speeds. Further, many conventional domino logic circuits operate using a two-phase clock. For very high operating frequencies, it may not be feasible to generate and distribute a two-phase clock due to noise, clock jitter and/or other issues.

Where a pulsed clock is used instead of a conventional two-phase clock, the logic may be more susceptible to functional errors due to race conditions making such circuits more difficult for design engineers to work with. Further, in a pulsed clock environment, circuit operation is typically triggered by a leading edge transition of the pulsed clock signal. It may be desirable in some cases to ensure overlap of signal trailing edges to provide for proper operation of the circuit.

In some cases, to synchronize edges of intersecting signals, a global domino-type circuit may be used. A disadvantage of prior global domino circuits is that a reset device in the domino circuit is toggled regardless of whether or not an associated domino node has evaluated.

Some prior domino circuits may instead use one or more self-resetting gates. Such self-resetting gates have an advantage in that a precharge pulse will not be terminated unless the associated domino node is fully precharged. A disadvantage of such circuits, however, is that it may be difficult to intersect two signals because such circuits typically operate based only on the leading edge of a pulsed signal.

BRIEF DESCRIPTION OF THE DRAWINGS

The present invention is illustrated by way of example and not limitation in the figures of the accompanying drawings in which like references indicate similar elements, and in which.

DETAILED DESCRIPTION

Embodiments of a pulsed circuit topology including global clock self-timed circuits with self-terminating precharge are described. In the following description, particular types of integrated circuits and integrated circuit configurations are described for purposes of illustration. It will be appreciated, however, that other embodiments are applicable to other types of integrated circuits and to integrated circuits configured in another manner.

For one embodiment, a global clock self-timed circuit controls initiation of a precharge (reset) pulse in response to which a domino node is precharged. A self-terminating precharge circuit coupled to the global clock self-timed circuit then terminates the precharge pulse only after the domino node has been precharged. Additional details of this and other embodiments are provided in the description that follows.

Such circuitry may be useful wherever high-speed domino circuitry is used. In particular, in a pulsed clock environment, where it is desirable for the trailing edges of two intersecting signals to coincide, the circuitry of various embodiments may be used to coordinate such signals while also maintaining a precharge pulse initiated by a global clock circuit until an associated domino node has been adequately precharged.

Figure 1:
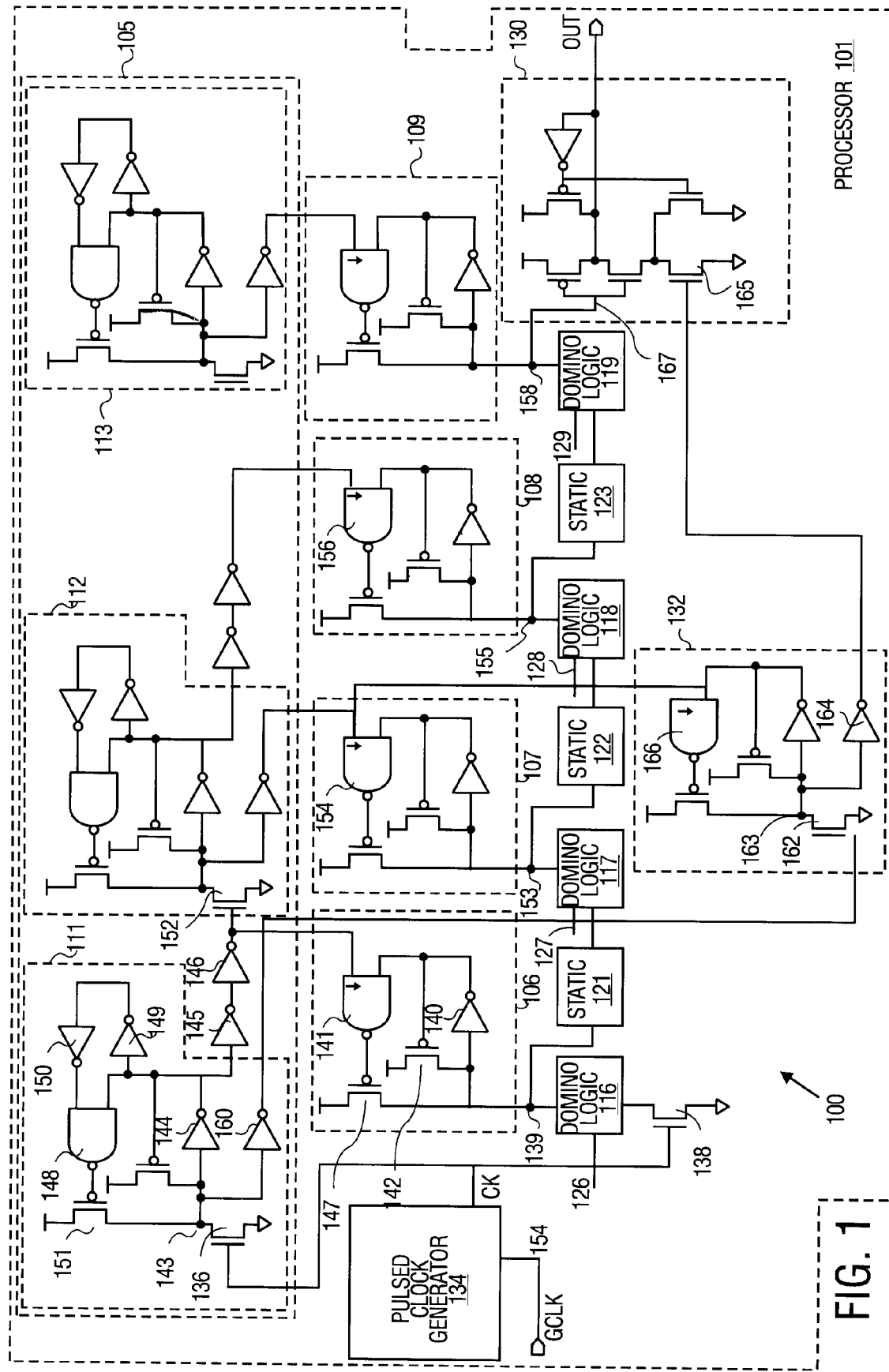
FIG. 1 is a schematic diagram of the pulsed circuit topology of one embodiment that includes global clock self-timed circuitry with self-terminating precharge circuitry.

FIG. 1 is a schematic diagram of an exemplary pulsed circuit topology 100 including global clock self-timed circuitry 105 (also referred to herein as global reset circuitry) and self-terminating precharge circuits 106–109 of one embodiment.

For the embodiment shown in FIG. 1, the global clock self-timed circuitry 105 includes three stages 111–113 that are configured and operate in a similar manner to each other. Further, the four self-terminating precharge circuits 106–109 are configured and operate in a similar manner to each other. Thus, the descriptions below of global clock self-timed circuitry stage 111 and self-terminating precharge circuit 106 also apply to the respective similar circuits.

The exemplary circuit topology 100 includes n-type domino logic stacks (shown as domino logic) 116–119 and static logic blocks 121–123. Each of the n-type domino logic stacks may perform any type of logical function (e.g. NAND, NOR, a complex logic function, etc.). Further, one or more of the n-type domino logic stacks 116–119 may receive input data and/or control signal(s) from preceding logic (not shown) via one or more inputs 126–129. The static logic blocks 121–123 may be inverters or inverting complex gates, for example. For one embodiment, the static logic blocks 121–123 are each implemented using ratioed logic. An example of such ratioed logic is set forth in U.S. Pat. No. 5,942,917 entitled "High Speed Ratioed CMOS Logic Structures for a Pulsed Input Environment," to Chappell et al., issued Aug. 24, 1999 and assigned to the assignee of the present invention.

The pulsed circuit topology 100 of FIG. 1 also includes a set-dominant latch (SDL) 130, and a clock delay circuit 132 (which may also be referred to as a latch protection circuit) that is configured and operates in a largely similar manner to the self-terminating precharge circuits 106–109 to delay a signal destined for the SDL 130 as described in more detail below.

A pulsed clock generator 134 may be included to provide a pulsed clock signal Ck from a two-phase, 50% duty cycle clock signal indicated in FIG. 1 as GClk (and also referred to as a global clock signal). Where the circuit 100 is implemented on a microprocessor or other type of processor 101, for example, the GClk signal may be the processor clock signal that is used to clock other surrounding circuitry (not shown). The Ck signal may have any desired frequency relationship with respect to the input GClk signal. For one embodiment, the pulsed Ck signal is twice the frequency of the GClk signal such that two Ck pulses are output from the clock generator 134 for each input GClk signal cycle.

Examples of circuits that may be used to implement the pulsed clock generator 134 of one embodiment are described in U.S. Pat. No. 6,023,182 to Milshtein et al. entitled, "High Gain Pulse Generator," issued Feb. 8, 2000 and in a copending U.S. patent application Ser. No. 09/159,548 entitled "Variable Width Pulse Generator," filed on Sep. 24, 1998, both of which are assigned to the assignee of the present invention. For other embodiments, a different type of pulsed clock generator or pulsed clock source may be used to provide the pulsed clock Ck signal received by the circuit 100.

In operation, a pulse of the Ck signal is concurrently received at pull-down gate 136 in the global reset circuitry 105 and pull-down gate 138 (also referred to herein as an evaluate device) coupled to the domino logic 116 and the self-terminating precharge circuit 106. For some embodiments, the domino logic 116 may include only (or be replaced by) the pull-down device 138. The operation of the self-terminating precharge circuit 106 is described first.

As described in more detail below, for the embodiment shown in FIG. 1, in response to a prior precharge pulse, a domino node 139 is precharged to a logic high level by the circuit 106. Subsequently, the rising edge of the Ck clock pulse enables the pull-down gate 138 such that a path to ground is provided for the domino logic 116. If the input(s) 126 are set appropriately such that the domino logic 116 evaluates low, the domino node 139 is pulled towards ground. As the domino node 139 is pulled towards ground, an output of an inverter 140, and, thus, input to a NAND gate 141, transition to a high level. This transition occurs approximately two inversions (i.e. gate or unit delays) after the rising edge of the Ck pulse is received at the pull-down gate 138. The transition at the output of the inverter 140 also causes a pull-up transistor 142 to be disabled. The other input to the NAND gate 141 is controlled by the global reset circuitry 105.

Referring to the global reset circuitry 105, the rising edge of the Ck pulse received at the pull-down gate 136 causes the pull-down gate 136 to be enabled such that a node 143 is pulled towards ground. This transition ripples through three series-coupled inverters 144–146 resulting in a logic high level at the other input to the NAND gate 141 four inversions after the Ck pulse was received at the pull-down gate 136.

Referring back to the self-terminating precharge circuit 106, when both inputs to the NAND gate 141 have transitioned to a logic high level, the output of the NAND gate 141 transitions to a logic low level. The transition of the NAND gate 141 output to a logic low level initiates a reset pulse at the gate of a precharge (reset) device 147 in the self-terminating precharge circuit 106 thereby enabling the precharge device 147. Enabling the precharge device 147 causes the domino node 139 to again be precharged to a logic high level. In this manner, initiation of a reset pulse for the domino logic 116 is controlled by the global reset circuitry 105 and thus, is referred to as being globally initiated.

Once the domino node 139 has been adequately precharged to a logic high level, an output of the inverter 140 transitions to a logic low level such that the pull-up device 142 is enabled and one input of the NAND gate 141 is at a logic low level. As the input of the NAND gate 141 transitions to a logic low level, its output goes high thereby self-terminating the precharge (reset) pulse and disabling the precharge device 147. In this manner, the reset pulse width at the gate of the reset device 147 substantially equal to 3 inversions.

Figure 2:
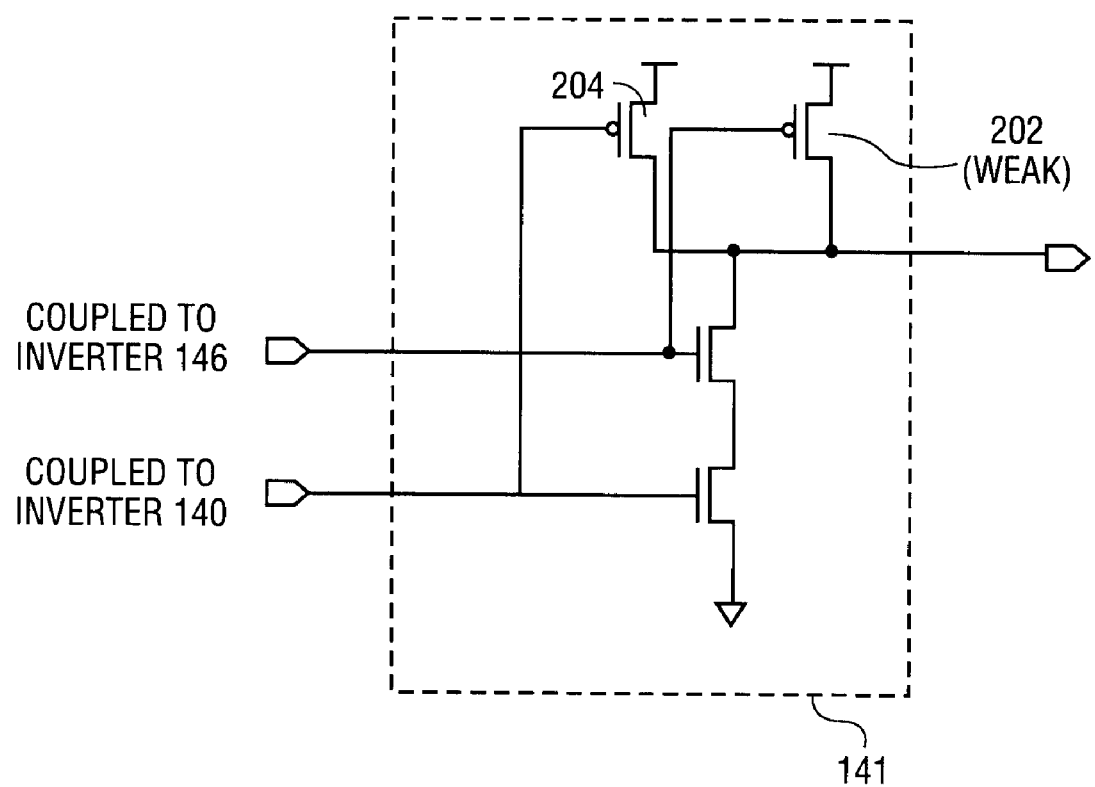
FIG. 2 is a schematic diagram of a NAND gate that may be used in the circuit of FIG. 1.

Referring to FIG. 2, for one embodiment, the NAND gate 141 is constructed such that a pull-up device 202 of the NAND gate 141 that is responsive to the global reset circuitry 105 (i.e. coupled to the output of the inverter 146) is weaker than a pull-up device 204 that is coupled to the output of the inverter 140. The relative size of the pull-up device 202 is selected such that the output of the NAND gate 141 cannot be pulled to a logical high level within the time period of interest when the device 202 alone is enabled. For the output of the NAND gate 141 to be pulled high (in the time period of interest), either the device 204 alone may be enabled, or both the devices 202 and 204 may be enabled. This type of NAND gate with one weaker pull-up device is indicated in the Figures by an arrow next to the input that is coupled to the weaker pull-up device.

Referring back to FIG. 1, in this manner, by itself, a transition of the input coupled to the global reset circuitry 105 cannot cause the output of the NAND gate 141 to transition to a logic high level in the time period of interest to terminate a precharge pulse. Thus, a precharge pulse is only terminated in response to adequate precharging of the domino node.

In the global reset circuit stage 111, as the node 143 is pulled low, the output of the inverter 144 goes high such that one input of a NAND gate 148 is high. Two inversions later (through inverters 149 and 150), the other input of the NAND gate 148 transitions to a high level causing the output of the NAND gate 148 to transition to a logic low level. The transition of the NAND gate 148 output to a low level enables a pull-up device 151 which, when turned on, causes the node 143 to be pulled high. The pull-up device 151 is then disabled three inversions after it has been activated as the signal transition is communicated through the inverter 144 to the NAND gate 148.

In the above-described manner, the combination of global and atomic (e.g. the self-terminating precharge) circuits illustrated in FIG. 1 enables signals, such as inputs to the domino logic 116 from a variety of sources, to be synchronized at a trailing edge to ensure that they coincide during an evaluation pulse. For embodiments described herein, the trailing edge of a data signal is indicated by the beginning of a reset pulse. Such synchronization may be desirable where, for example, pattern dependent variations across datapath stages could cause input signals to arrive early and cause an early evaluation. The above-mentioned combination accomplishes this synchronization while toggling the reset device 147 only if the domino node 139 has evaluated and while self-terminating the precharge pulse only after the domino node 139 has been adequately precharged. In this manner, some of the disadvantages of prior global reset circuitry are addressed.

For the embodiment shown in FIG. 1, multiple stages of domino logic and associated global and self-terminating precharge circuitry are included as mentioned above. For one embodiment, a domino stage and associated reset circuitry (referred to collectively as a restoring stage) are included at various points along the pipestage to prevent pulse evaporation as well as to provide additional flexibility in determining the pulse width of the reset pulse. For one embodiment, these restoring stages are provided along the pipestage for every three inversions of delay. For other embodiments, restoring stages may be located at other regular or irregular intervals along the pipestage.

With continuing reference to FIG. 1, the transitions at domino node 139 are rippled through the static stage 121 (which is an inverting stage for one embodiment) and provided as one input to domino logic stage 117 along with any other input signal(s) received over input(s) 127. The transitions at node 143 of the global reset circuitry stage 111 are rippled through inverters 144–146 to a pull-down gate 152 of a global reset stage 112.

The self-terminating precharge stage 107 and the global reset stage 112 are configured and operate in a similar manner to the corresponding stages 106 and 111, respectively, as mentioned above to control precharge pulses in response to which a domino node 153 is precharged. For the self-terminating precharge stage 107, however, the input from the global reset circuitry 105 to a NAND gate 154 transitions to a logic high level approximately six inversions after the Ck pulse rising edge is received at the pull-down gate 136. Thus, a reset pulse that controls precharging of the domino node 153 is initiated approximately seven inversions after the pulse is received at the pull-down gate 136. The reset input pulse at the output of the NAND gate 154, like the reset input pulse at the output of the NAND gate 141, is approximately three inversions wide.

Transitions of the domino node 153 are communicated through the static logic stage 122 and provided as one input to the domino logic stage 118 along with any other input signal(s) received over the input(s) 128. The pulse width of the precharge pulse that controls precharging of a domino node 155 is controlled by the global reset stage 112 and the self-terminating precharge stage 108. For this stage, the rising edge of the Ck pulse received at the pull-down 136 causes one input of a NAND gate 156 to transition to a logic high level eight inversions later. In this manner, a reset pulse at the output of the NAND gate 156 is initiated nine inversions after the Ck pulse is received at the pull-down device 136. The self-terminating precharge circuit 108, like the self-terminating precharge circuit 106, clips the reset pulse at the output of the NAND gate 156 to have a pulse width substantially equal to three inversions.

Similarly, transitions of the domino node 155 are communicated through the static logic stage 123 and provided as one input to the domino logic stage 119 along with any other input signals received over input(s) 129. A reset pulse that control transitions of a domino node 158 is controlled by the global reset circuit stage 113 and the self-terminating precharge stage 109. For this stage of the pipestage, a three inversion-wide reset pulse is globally initiated eleven inversions after the Ck signal pulse rising edge is received at the pull-down gate 136.

Transitions of the domino node 158 are provided as data to the SDL 130. The SDL 130 of one embodiment provides an interface between pulsed and static circuitry by receiving a pulsed signal and outputting a corresponding static signal. The SDL 130 is also controlled by the clock delay circuit 132, which is configured and operates in a largely similar manner to the self-terminating precharge stages 106–109. The rising edge of the Ck signal pulse referred to above enables the pull-down device 136 as discussed above. This causes an output of an inverter 160 in the global reset stage 111 to transition to a high level to enable a pull-down device 162 in the clock delay circuit 132. As the pull-down device 162 is enabled, a node 163 is pulled low causing an output of an inverter 164 to transition to a high level to enable a pull-down gate 165 in the SDL 130. Thus, the pull-down device 165 in the SDL 130 is enabled five inversions after the Ck signal pulse is received at the pull-down gate 136.

With continuing reference to the clock delay circuit 132, pulling the node 162 low causes one input of a NAND gate 166 to be high one inversion later. The other input to the NAND gate 166 is received from the global reset circuitry 105 and tied to one input of the NAND gate 154 in the self-terminating precharge stage 107. This other input signal arrives at the NAND gate 166 six inversions after the rising edge of the Ck signal pulse arrives at the pull-down device 136 such that a precharge pulse at the output of the NAND gate 166 is initiated one inversion later. Thus, the trailing edges of signals passing through the domino logic 117 and the clock delay circuit 132 are synchronized (i.e. charging of the nodes 153 and 163 is initiated concurrently) as shown in the timing diagram of FIG. 3. This charging of the nodes 153 and 163 is indicated by the areas of the corresponding signals that are labeled RESET. (The dotted lines of FIG. 3 indicate that the signal level at that point is dependent on the state of the corresponding domino logic input(s).)

The clock delay circuit 132 includes a self-terminating precharge circuit similar to the self-terminating precharge stage 106. Thus, two inversions after the node 163 has been adequately charged, the precharging pulse is terminated such that the precharge pulse has a pulse width substantially equal to three inversions.

The SDL 130 operates to latch an inverse of a data value indicated by the domino logic 119 in response to an evaluate pulse. In this manner, the SDL sustains a data pulse that has been rippled through the domino and static logic stages 116–119 and 121–123, respectively, for use by downstream logic (not shown). The SDL 130 may also be referred to in conjunction with the self-terminating precharge circuit 109 and the domino logic 119 as a self-timed, pulsed domino flip-flop. A similar structure and its various attributes along with some other structures that may be used for other embodiments are described in more detail in a copending U.S. patent application, Ser. No. 09/607,857, entitled "Pulsed Circuit Topology Including a Pulsed, Domino Flip-Flop", filed concurrently herewith and assigned to the assignee of the present invention. This particular SDL 130 is used for one embodiment due to its favorable operating characteristics in a high frequency environment.

With continuing reference to FIG. 1, the data pulse that has been rippled through the domino and static logic stages arrives at an input 167 to the SDL 130 seven inversions after the Ck pulse rising edge is received at the pull-down device 138. The domino node 158 begins to be precharged 12 inversions after the Ck pulse rising edge is received at the pull-down devices 138 and 136 in response to a precharge pulse initiated by the global reset circuitry 105 (in particular, the global reset stage 113). Thus, the data pulse at the SDL input 167 is approximately five inversions wide.

Figure 3:
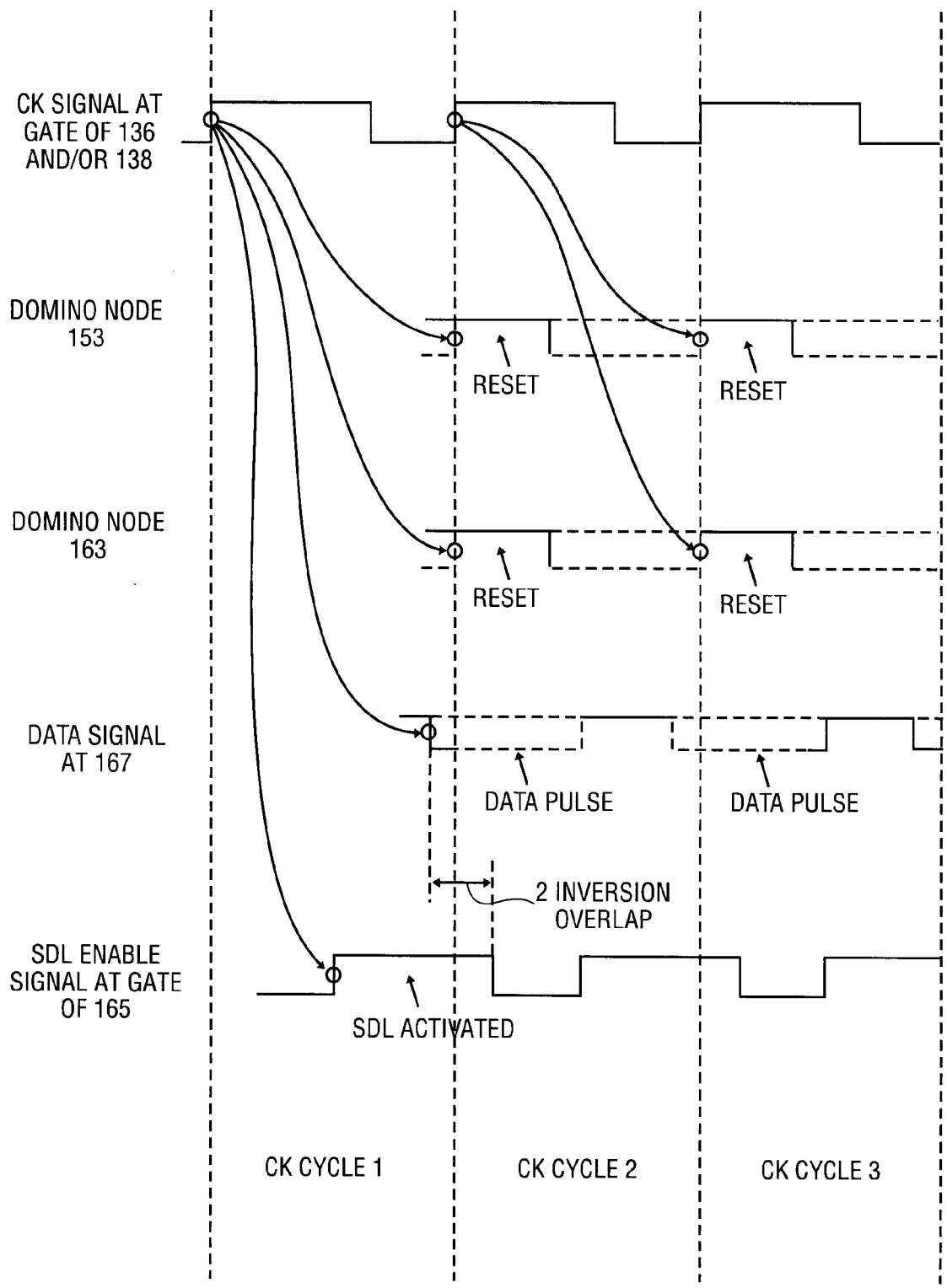
FIG. 3 is a timing diagram showing exemplary signals corresponding to the circuit of FIG. 1.

The SDL pull-down device 165 operates to activate the SDL 130 such that a reset of the SDL 130 is triggered for each cycle of the Ck clock signal. The delayed Ck clock signal (delayed by the clock delay circuit 132) is received at the SDL pull-down device 165 four inversions after the Ck signal is received at the pull-down devices 136 and 138. A reset pulse to precharge the node 163 is initiated by the global reset stage 112 such that the pull-down device 165 is enabled for approximately five inversions. In this manner, the data pulse overlaps with the time period during which the SDL 130 is activated by approximately two inversions of margin as shown in FIG. 3.

Further, for one embodiment, where the Ck signal pulse is approximately five inversions wide, the signal that activates the device 165 transitions to a logic low value approximately nine inversions after the rising edge of the Ck clock signal is received at the gate of the device 138. As mentioned above, the node 158 is precharged high approximately 12 inversions after the rising edge of the Ck clock signal is received at the gate of the device 138. Thus, approximately three inversions of margin separate the precharge of the node 158 from the time at which the SDL 130 is disabled. This margin may be referred to as the "latch race." Other race conditions and/or design considerations for the SDL 130 are described in more detail in the copending U.S. patent application referenced above.

By using the global reset circuitry 105, trailing edges of signals in a high frequency, pulsed clock environment may be synchronized while avoiding many of the drawbacks that may be associated with prior global reset circuitry. As described above, trailing edges of data signals are synchronized at each of the domino stages 116–119. In this manner, each of the domino stages 116–119 can receive multiple inputs from different sources and the signals will be synchronized at their trailing edges. Thus, an early evaluate due to pattern dependence of preceding logic stages, for example, may be avoided.

For another embodiment, where the total number of devices may be of concern, for example, only one of the inverters 144 or 160 may be used (and only one of the corresponding inverters in subsequent stages) as these inverters are logically equivalent. Using both inverters, however, may provide for more flexibility in timing because they may be sized differently to provide different delays where desired. Further, where reset signals are driven through relatively long wires, providing a separate inverter to drive the signal that controls the reset pulse may reduce the effects of unnecessary coupling.

FIGS. 4–23 illustrate other embodiments of pulsed circuit topology that may benefit from the global clock self-timed circuitry with self-terminating precharge circuitry of various embodiments.

Figure 4:
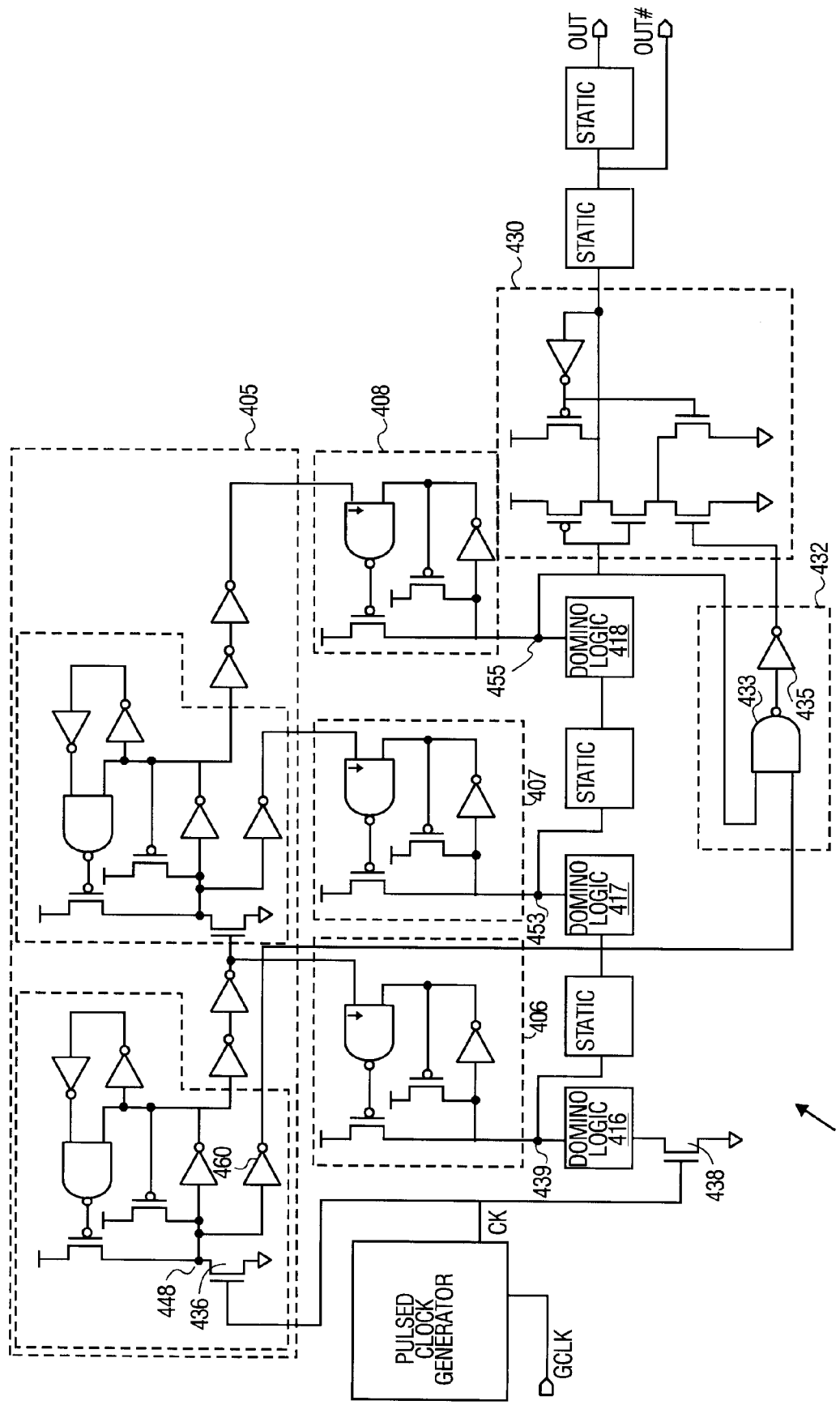
FIG. 4 is a schematic diagram of the pulsed circuit topology of another embodiment.

FIG. 4 shows an embodiment, for example, in which an SDL 430 is included earlier in the pipestage (i.e. at the sixth stage in the pipestage) than the SDL 130 of FIG. 1. Fewer domino stages 416–418 are thus, included in the circuit 400 of FIG. 4, and therefore, fewer self-terminating precharge circuits 406–408 are included. Global clock self-timed circuitry (also referred to as global reset circuitry) 405 is provided to globally initiate precharge pulses to control precharging of domino nodes 439, 453 and 455 in a similar manner to that described above in reference to FIG. 1. The global reset circuitry 405 includes one less stage than the global reset circuitry 105 of FIG. 1, however, due to the smaller number of domino stages and corresponding self-terminating precharge circuits.

A clock delay circuit 432 of FIG. 4 to control operation of the SDL 430 is configured in a different manner than that of the embodiment of FIG. 1. The clock delay circuit 432 includes a NAND gate 433 and an inverter 435. A first input to the NAND gate 433 is received from global reset circuitry 405 and a second input to the NAND gate 433 is received from the domino node 455.

In operation, if the SDL 430 is holding a high value from a previous cycle, the output of the SDL 430 transitions low approximately five inversions after the rising edge of the Ck signal is received at the gate of the transistor 436 (otherwise, it will simply remain low). Assuming inputs to the various domino and/or static logic stages are set appropriately, however, the domino node 455 will evaluate low approximately five inversions after the rising edge of the Ck signal is received at the gate of the device 438 (concurrently with receiving the rising edge at the gate of the device 436).

When the domino node 455 evaluates low, the output of the SDL 430 transitions high regardless of the logic state at the output of the inverter 435. As the domino node 455 evaluates low, it forces the output of the NAND gate 433 high and thus, the output of the inverter 435 low, such that the reset leg of the SDL 430 is disabled. In this manner, when the domino node 455 is precharged again, the SDL 430 will not be falsely reset. Thus, the NAND gate 433 and inverter 435 may provide additional margin for the latch race design constraint for the embodiment shown in FIG. 4.

Figure 5:
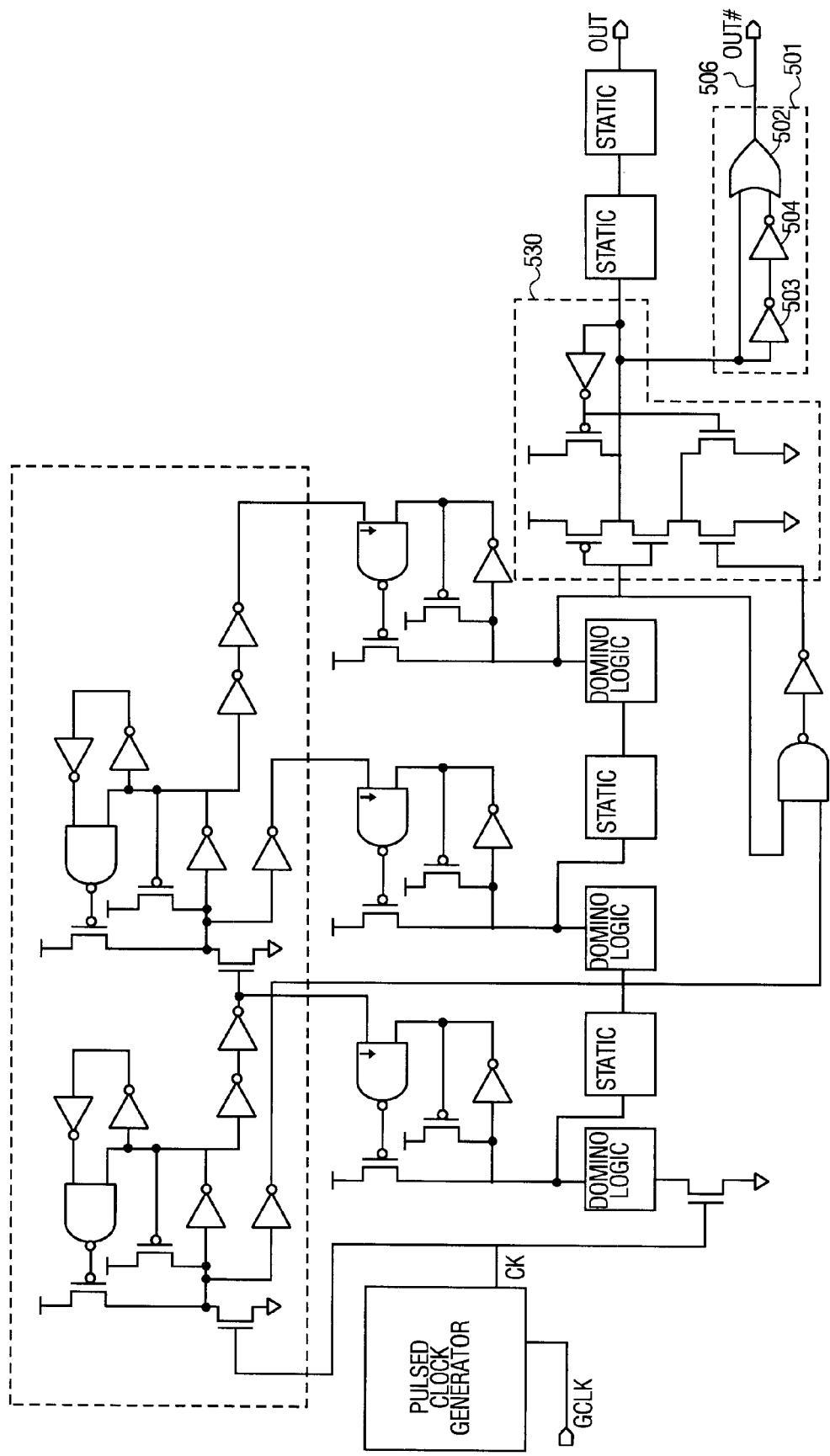
FIG. 5 is a schematic diagram of the pulsed circuit topology of another embodiment including an edge shifter.

FIG. 5 illustrates another example of a pulsed circuit topology that uses global reset and self-terminating precharge circuitry of one embodiment. The embodiment shown in FIG. 5 is substantially similar to that shown in FIG. 4. For the embodiment of FIG. 5, however, a complementary output signal (OUT#) is also provided using an edge shifter circuit 501.

The edge shifter circuit 501 of FIG. 5 includes a NOR gate 502 having one input coupled to an output of the SDL 530. The other input to the NOR gate 502 is coupled to two series-coupled inverters 503 and 504 such that it receives the output signal from the SDL 530 delayed by two inversions. The NOR gate 502 provides a complementary form of the SDL 530 output signal (OUT#) at the output node 506. Thus, when coupling the circuit of FIG. 5 to a subsequent pipestage (not shown), either the true or complementary form of the output signal may be used.

In operation, when the output signal from the SDL 530 is low, both inputs to the NOR gate 502 are low such that the output of the NOR gate 502 is high. As the signal at the output of the SDL 530 transitions from low to high, the input to the NOR gate 502 that is directly coupled to the SDL output also transitions. Thus, the output of the NOR gate 502 transitions to a logic 0 value to provide a complementary signal.

A high to low transition at the SDL 530 output node causes the same transition at the input to the NOR gate 502 that is directly coupled to the SDL 530 output. Due to the logical operation of the NOR gate 502, however, the output of the NOR gate 502 does not transition from a logic low state to a logic high state until two inversions later when the other NOR gate 502 input transitions from high to low. In this manner, a low to high transition of the output is delayed.

Thus, using the edge shifter 501, an extra inversion of margin may provided for min-delay race protection as described in more detail in the copending U.S. patent application entitled "Pulsed Circuit Topology Including a Pulsed, Domino Flip-Flop" mentioned above. For other embodiments, a different type of edge shifter may be used and/or if the edge shifter is coupled at a different location in the pipeline, a complementary edge shifter that delays a high to low transition may be used. Some examples of other edge shifters that may be used are provided in the same copending U.S. Patent Application.

Figure 6:
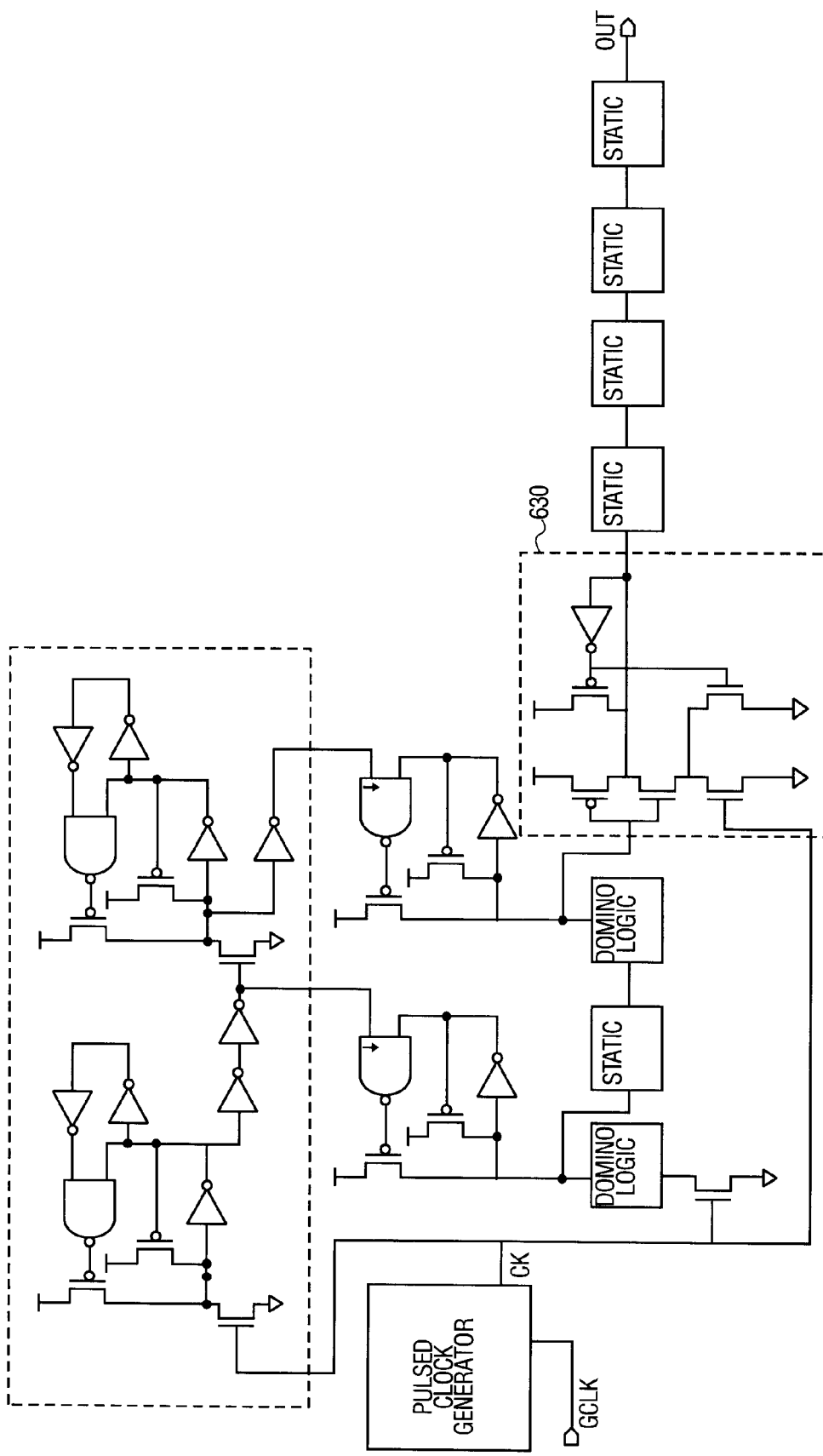
FIGS. 6–9 are schematic diagrams of the pulsed circuit topology of alternative embodiments including global clock self-timed circuitry with self-terminating precharge.

FIG. 6 illustrates another example of a pulsed circuit topology in which the global reset circuitry and self-terminating precharge circuitry of one embodiment may be advantageously used. For the embodiment of FIG. 6, the SDL 630 is included even earlier in the pipestage as shown. Because of the location of the SDL 630 in the pipestage, a clock delay circuit is not needed to delay arrival of a clock rising edge at the SDL 630.

Figure 7:
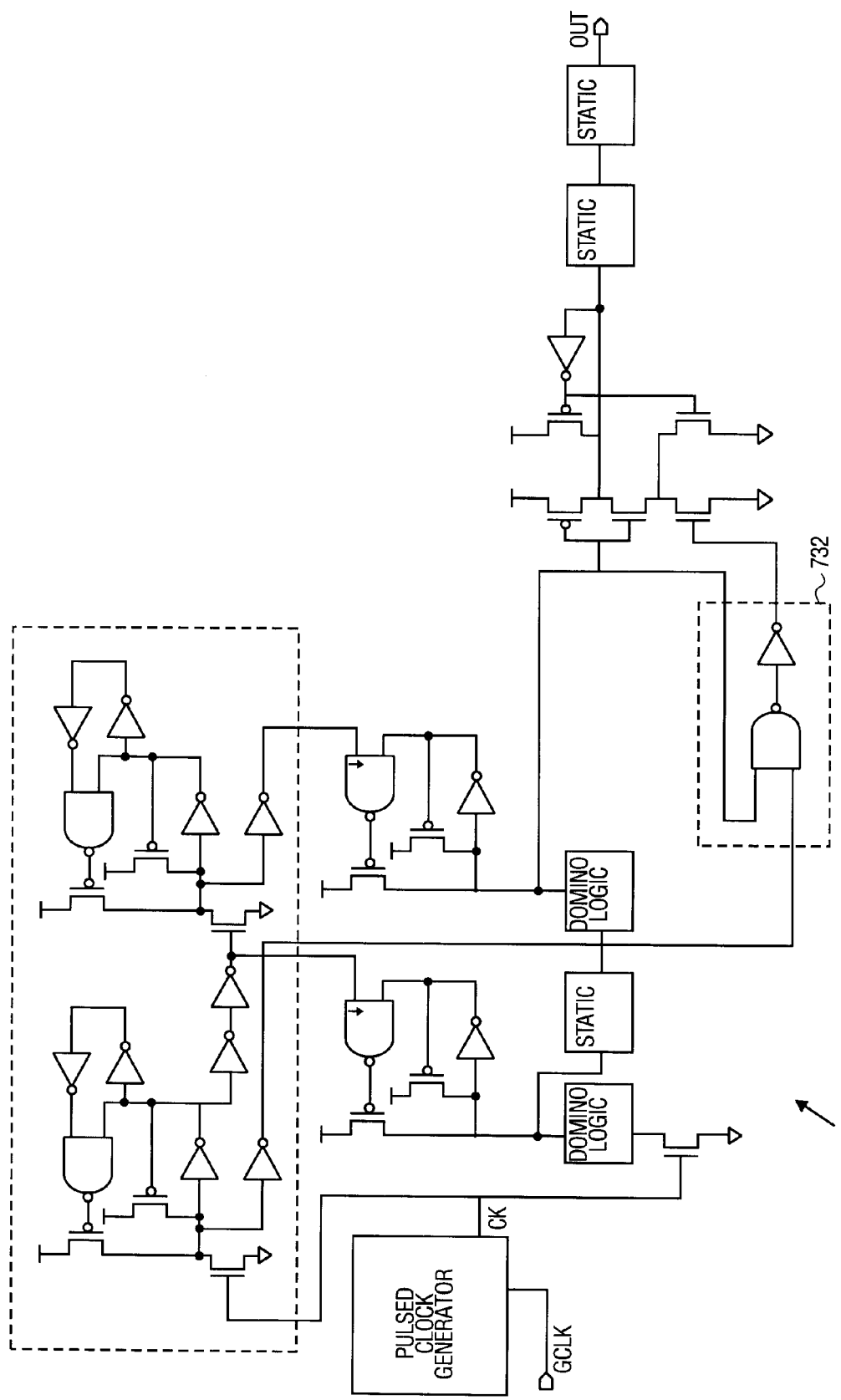

Another example, similar to that of FIG. 6 is shown in FIG. 7. For the example of FIG. 7, fewer circuit stages are included in the circuit 700 and thus, a clock delay circuit 732, similar to the clock delay circuit 432 of FIG. 4 is included. The clock delay circuit 732 is provided to prevent the reset of the SDL from propagating to the output node of the pipestage too early resulting in an insufficient hold high time of the output signal.

Figure 8:
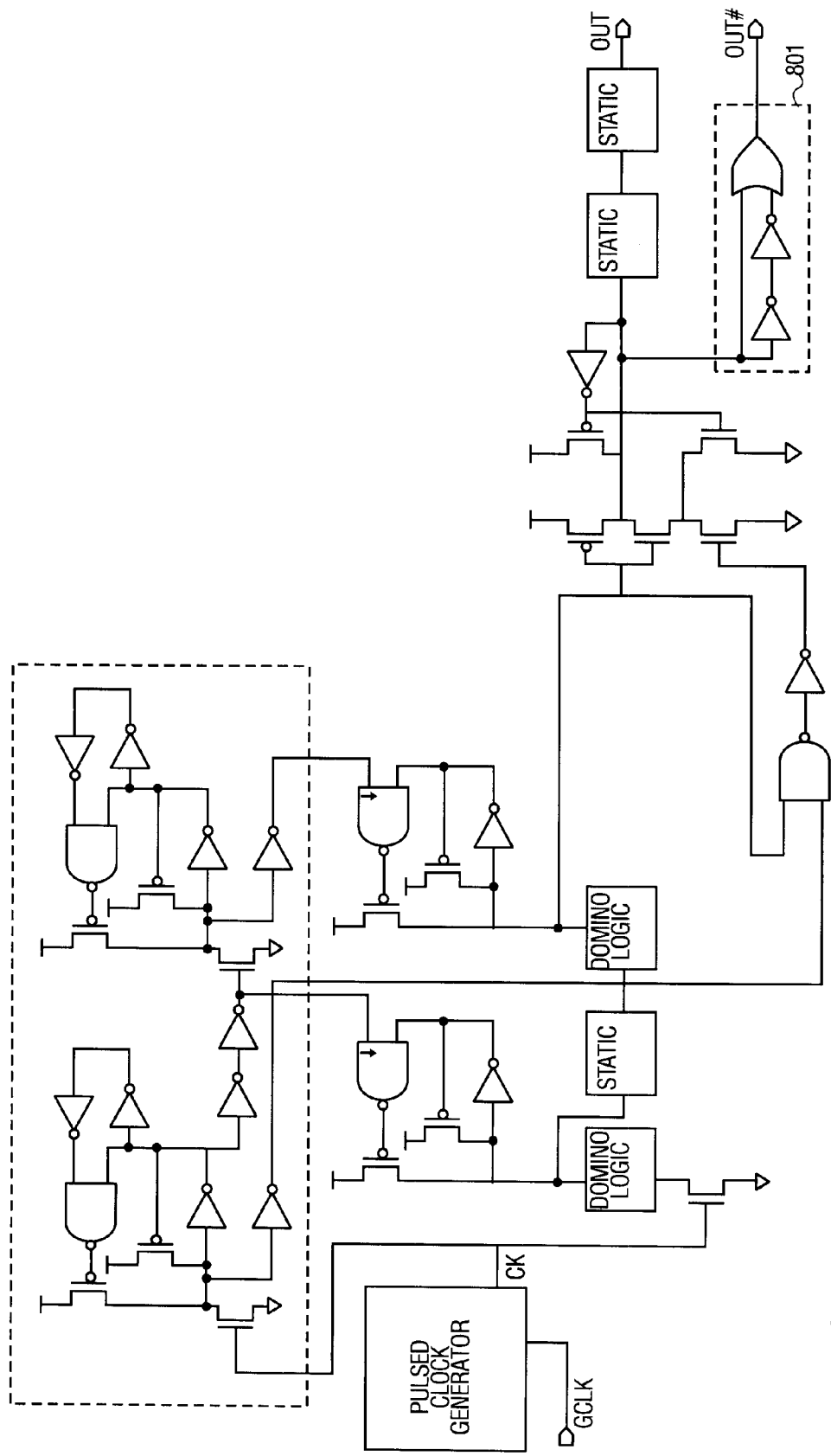
Figure 15:
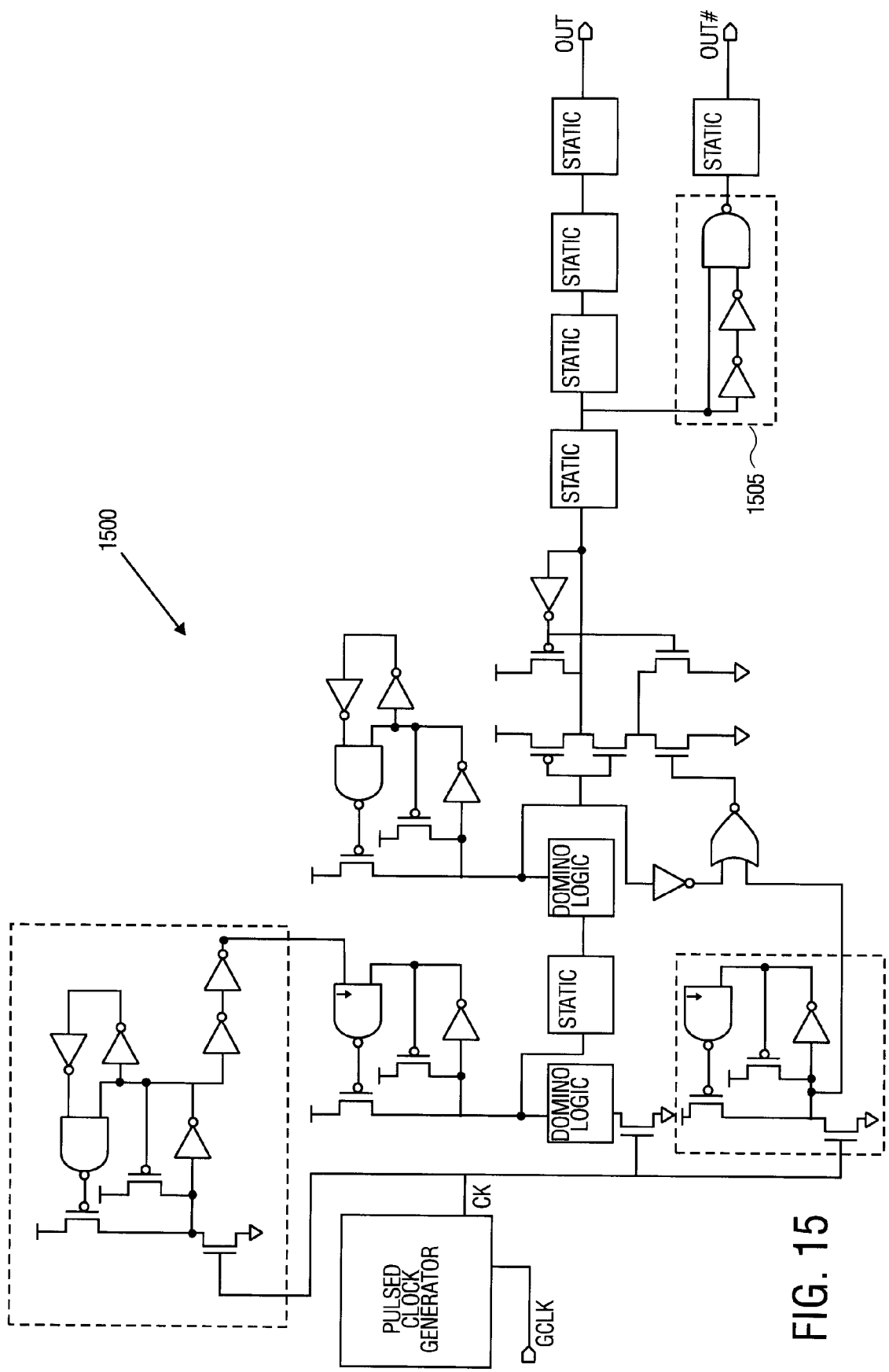
FIGS. 15–16 are schematic diagrams of the pulsed circuit topology of other embodiments including global clock self-timed circuitry with self-terminating precharge and an edge shifter circuit.
Figure 16:
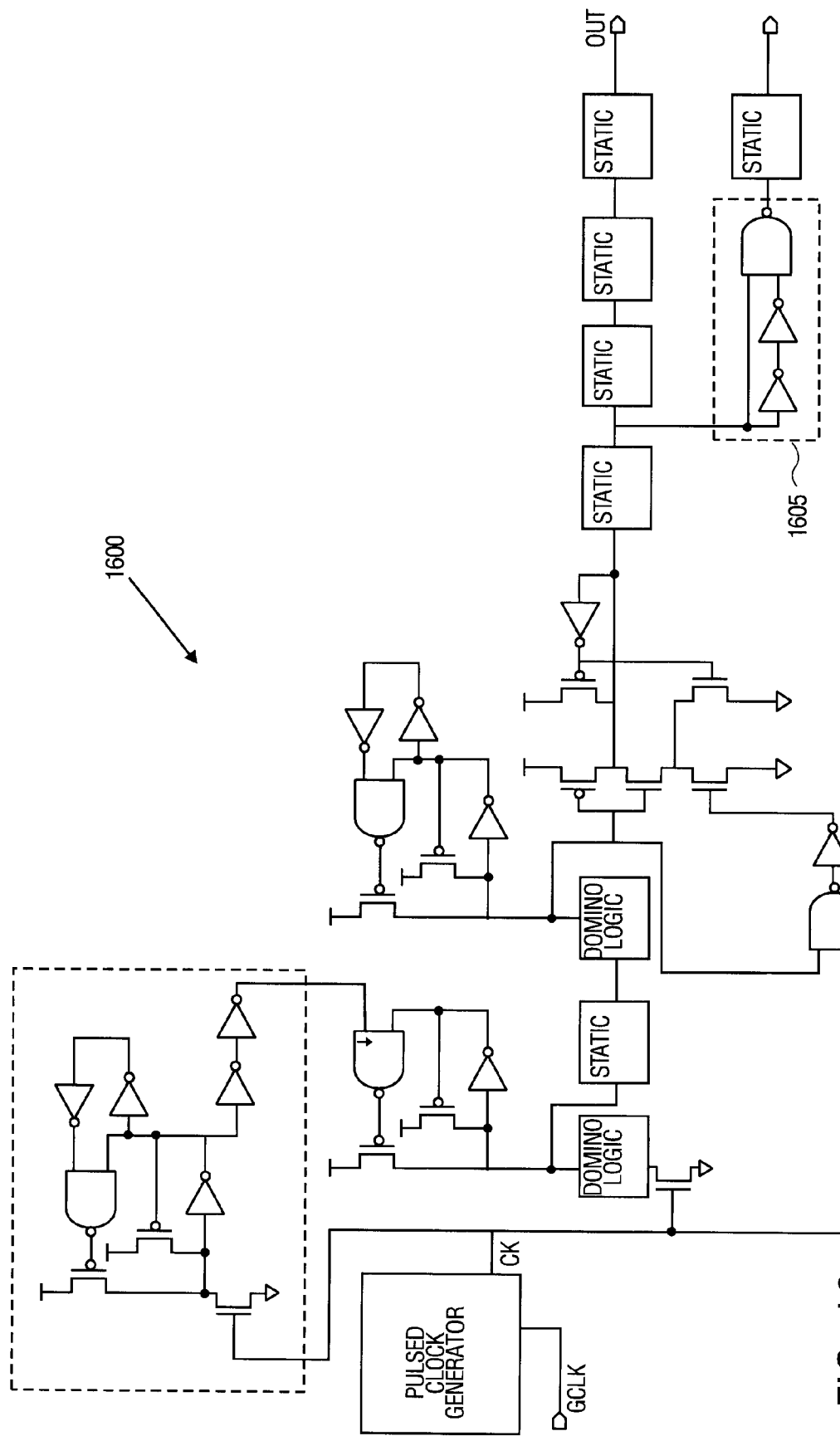
Figure 17:
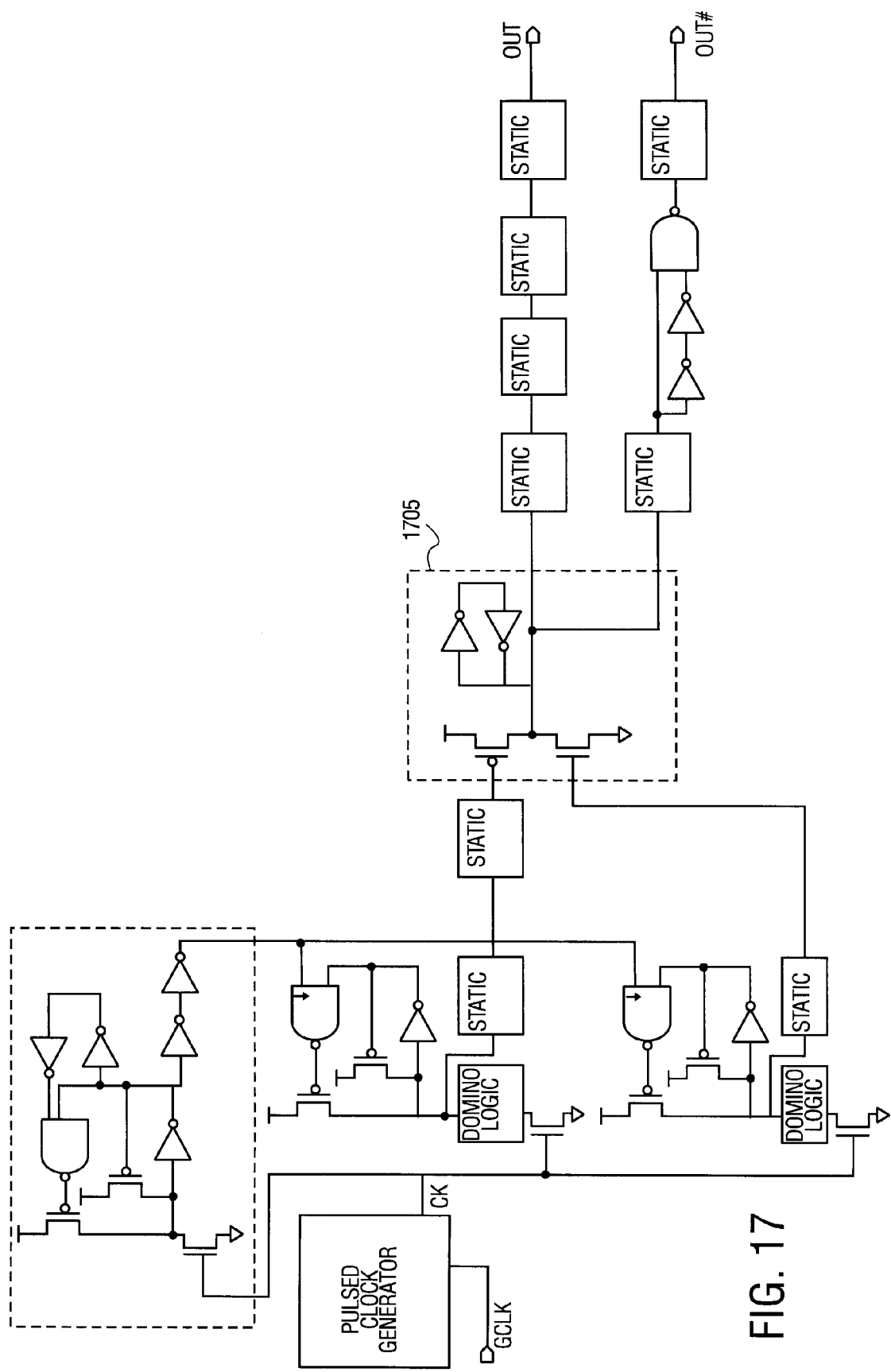
FIG. 17 is a schematic diagram of the pulsed circuit topology of one embodiment including another embodiment of a latch.

The pulsed circuit topology of FIG. 8 is similar to that of FIG. 7, except that an edge shifter 801 has been added such that a complementary signal may also be provided as described in reference to FIG. 5. FIGS. 15 and 16 illustrate circuits 1500 and 1600 that each include an edge shifter 1505 (1605) that is complementary to the edge shifter of FIG. 8 (i.e. it shifts transitions in the other direction).

Figure 9:
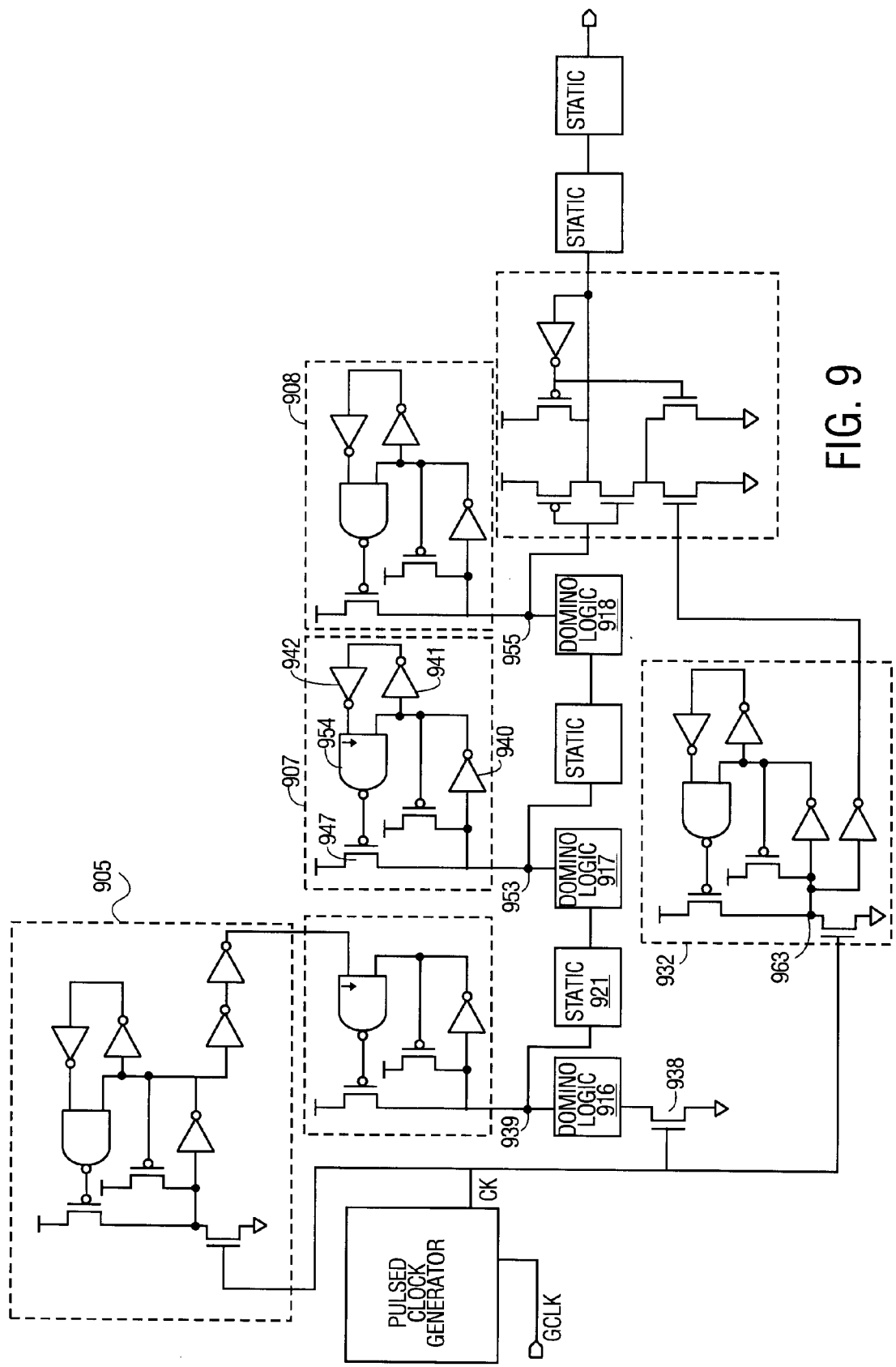

The pulsed circuit topology of FIG. 9 differs from the pulsed circuit topology of FIG. 1 in several respects. For this embodiment, global reset circuitry 905 only includes a single stage that is used to globally initiate a precharge pulse to control precharging of domino node 939 in the manner described in reference to the domino node 139 of FIG. 1. Reset pulses to control precharging of other domino nodes 953 and 955 in the circuit 900 are both locally initiated and terminated by atomic reset circuits 907 and 908, respectively, as described in more detail below. Further, the clock delay circuit 932 for this embodiment is also implemented using an atomic reset circuit.

Atomic reset circuits that both self-initiate and self-terminate precharge pulses to control precharging at respective local domino nodes may be used, for example, where it is not critical to synchronize trailing signal edges of input signals. For the circuit 900 of FIG. 9, for example, the global reset circuit 905 may be used to initiate a precharge pulse to control precharging of the domino node 939 because the n-type domino logic 916 may receive input data over inputs 926 from multiple sources that may be subject to, for example, pattern dependent timing variations. The other domino stages 917 and 918, however, may only receive the signal that is rippled down the pipeline from domino stage 916 or pattern dependence of preceding logic may not be an issue and thus, domino stages 917 and 918 do not require synchronization of signal trailing edges.

The operation of atomic reset circuit 907 is described for purposes of example. A rising edge of a Ck signal pulse received at the pull-down device 938 causes the domino logic 916 to evaluate such that a data value is indicated at the domino node 939. The data value at the domino node 939 ripples through the static stage 921 to the domino logic gate 917. If input(s) to the domino logic 916, static stage 921 and/or domino logic 917 are set appropriately such that the domino logic 917 evaluates low, the domino node 953 is pulled down.

Pulling the domino node 953 down causes one input of a NAND gate 954 to transition to a logic high level (through an inverter 940) one inversion later. The other input to the NAND gate 954 transitions to a logic high level (through inverters 941 and 942) two inversions after the transition of the first NAND gate 954 input. When both inputs to the NAND gate 954 are high, the output of the NAND gate 954 transitions to a low level to initiate a precharge pulse and enable a precharge device 947. Enabling precharge device 947 causes the domino node 953 to be pulled to a logic high level.

When the domino node 953 has been adequately precharged such that a logic high level is indicated, an output of the inverter 940 (and thus, one input to the NAND gate 954) transitions to a logic low level. The output of the NAND gate 954 then transitions to a logic high level to self-terminate the precharge (reset) pulse and disable the precharge device 947.

In the above-described manner, using the atomic reset circuit 907, a data pulse width is substantially equal to five inversions and a reset pulse width is substantially equal to three inversions. Atomic reset circuits similar to the atomic reset circuit 907 and examples of other reset circuits that may be used for other embodiments are described in more detail in U.S. Pat. No. 6,239,621 entitled, "Two Legged Reset Controller", to Milshtein et al., issued May 29, 2001 and assigned to the assignee of the present invention. Other types of atomic reset circuits may be used for other embodiments.

It will be appreciated that atomic reset circuits 908 and 932 operate in a similar manner to self-initiate and self-terminate precharge pulses to control precharging of corresponding domino nodes 955 and 963, respectively.

Where the above-described pulsed circuit topology is being used for longer distance signaling from unit to unit or cluster to cluster, for example, there can be greater discrepancy between clock signals and other signals, and thus, greater uncertainty in terms of meeting constraints. For such implementations, additional receiver side circuitry may be used to provide enhanced protection from min-delay race failures.

Figure 10:
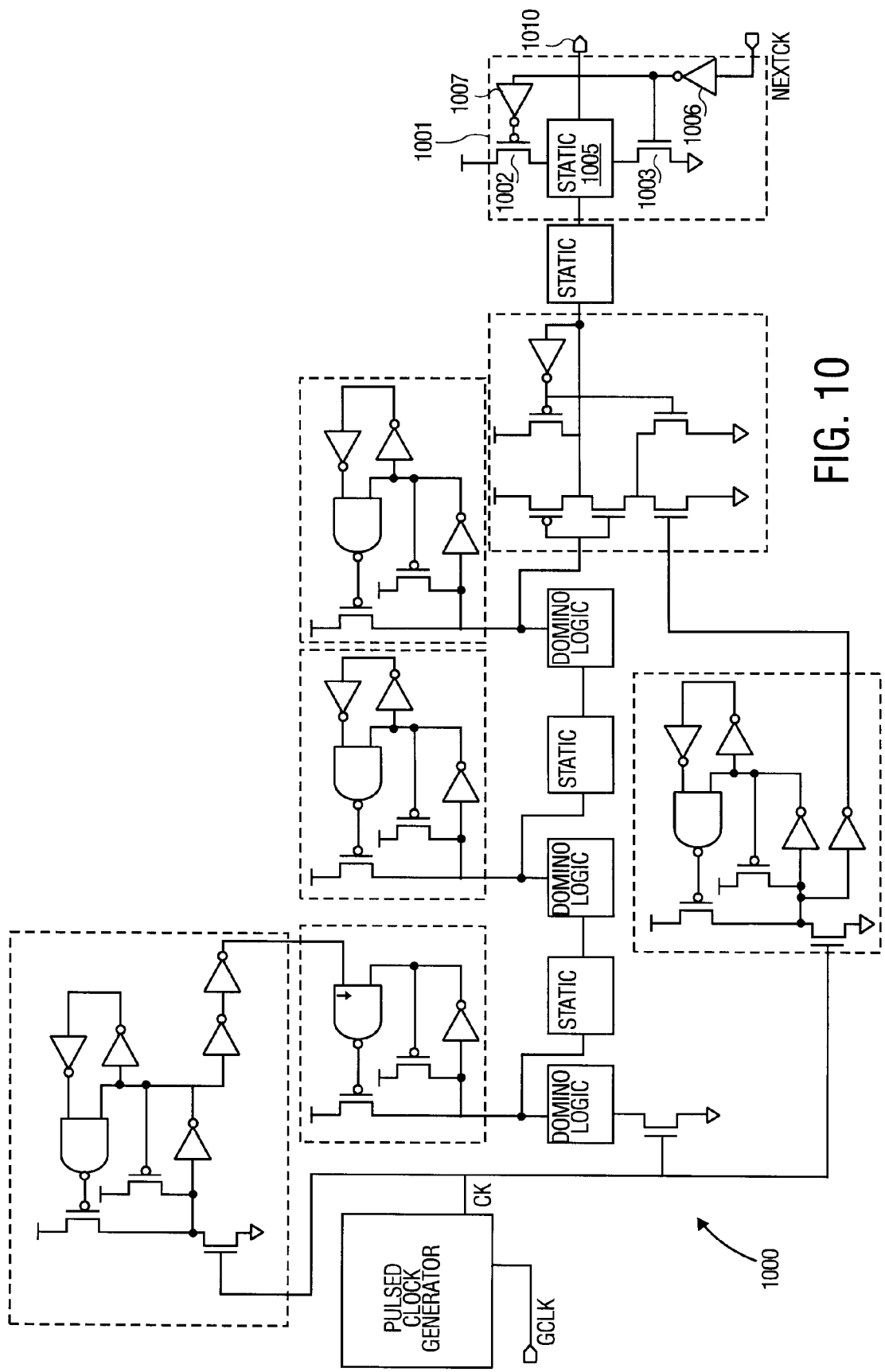
FIGS. 10–14 are schematic diagrams of the pulsed circuit topology of various embodiments including global clock self-timed circuitry with self-terminating precharge and various blocker circuit configurations.
Figure 11:
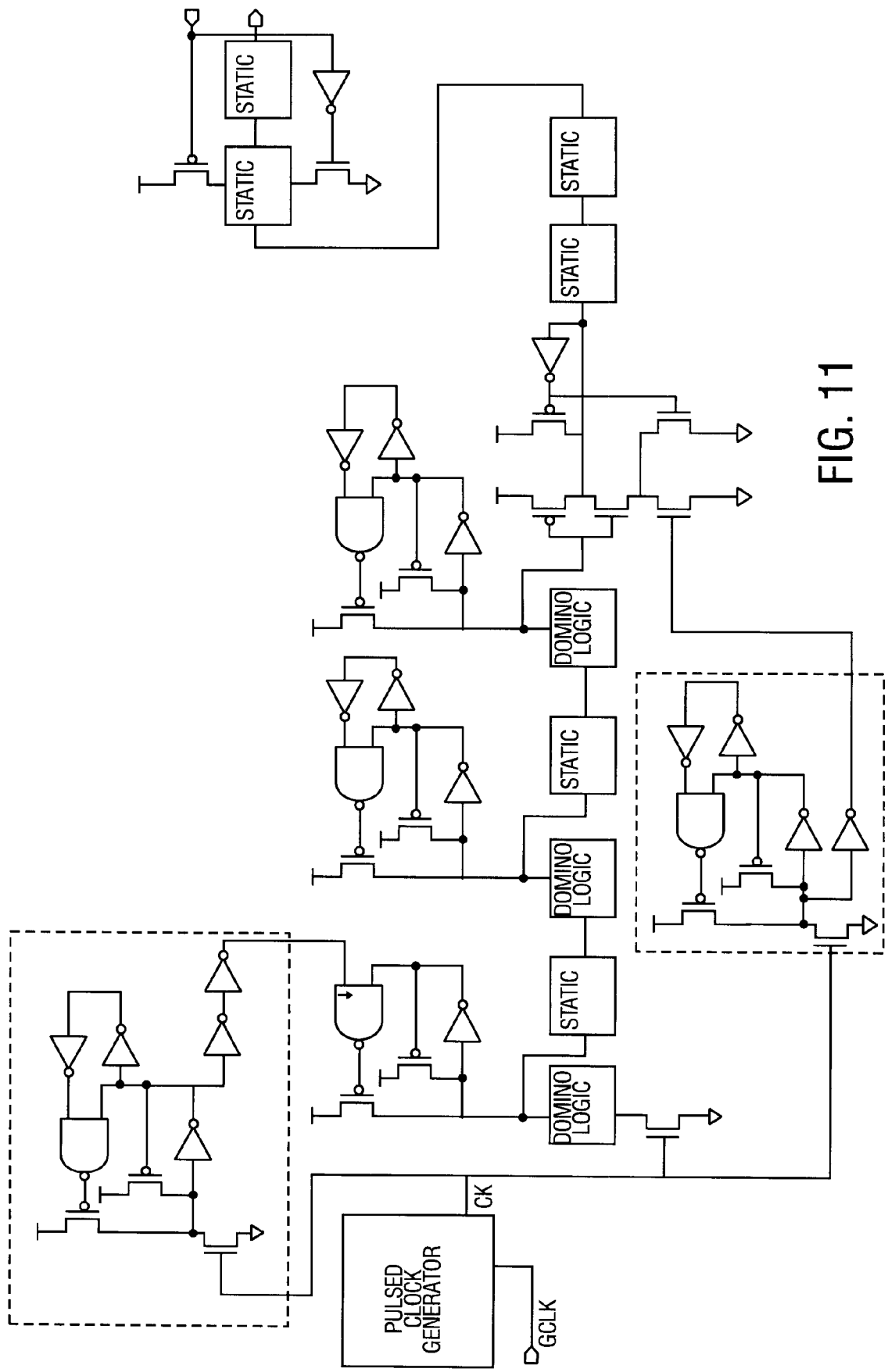
Figure 12:
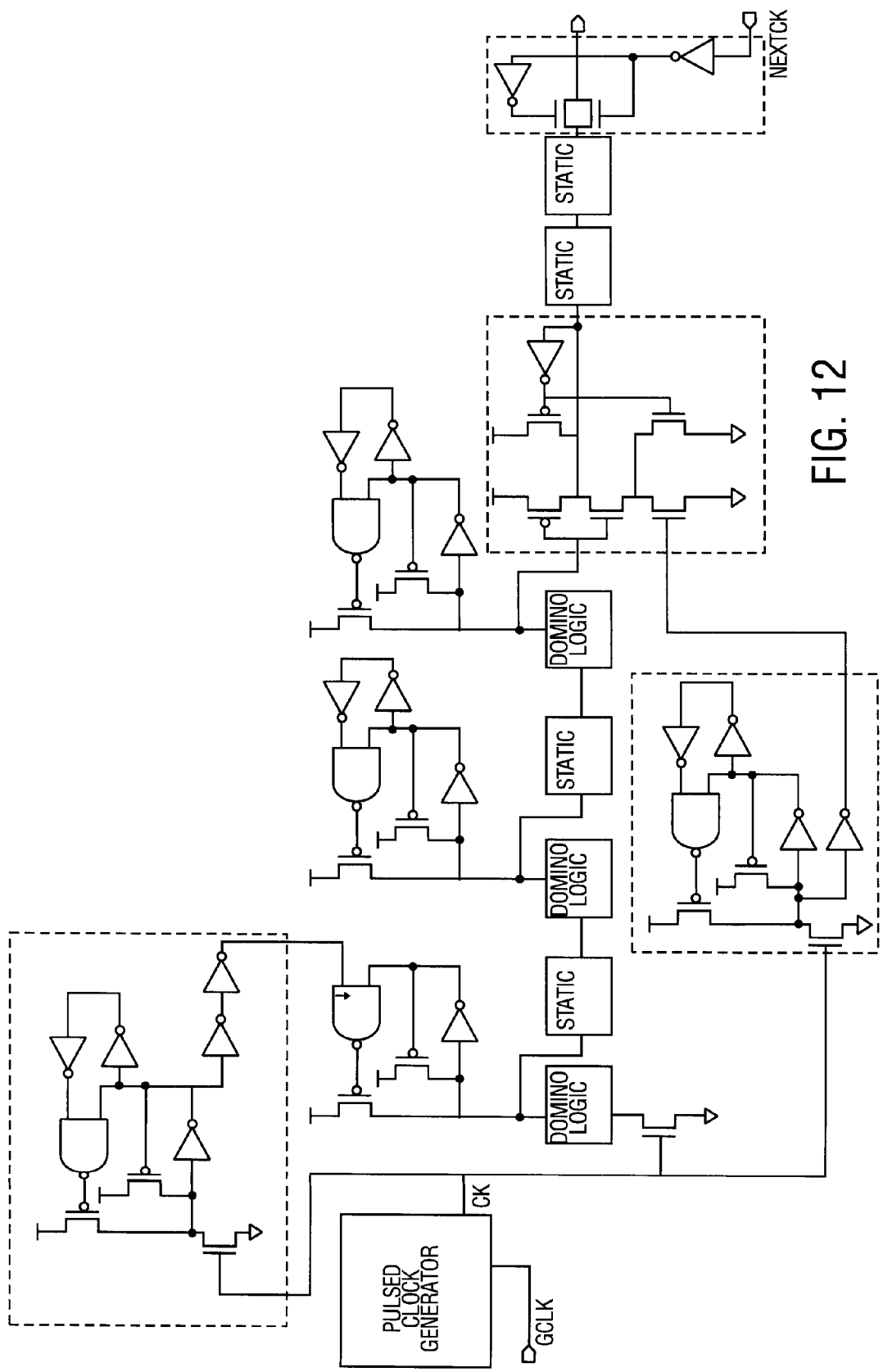

Referring to FIG. 10, for example, for one embodiment, a redundant latch (also referred to as a dynamic full blocker) such as the redundant latch structure 1001 may be used. The redundant latch 1001 includes a PFET 1001 coupled between the power supply and static logic stage 1005 and NFET 1003 coupled between the static logic stage 1005 and ground. A gate of the PFET 1001 is coupled to receive a true form of the NextCk signal from a subsequent pipestage (not shown) through inverters 1006 and 1007, while the gate of the NFET 1003 is coupled to receive a complementary form of the NextCk signal through the inverter 1006. NextCk is used to refer to a pulsed clock signal used to clock the subsequent pipestage. For another embodiment, for noise reasons, the PFET 1002 is coupled between the pull-up network and output of the static logic stage 1005 while the NFET 1003 is coupled between the pull-down network and output of the static logic stage 1005.

In operation, when the NextCk signal rises activating logic of the next pipestage (not shown), both the PFET 1002 and the NFET 1003 are disabled, thereby blocking transmission of the data signal from the circuit 1000 at the static logic gate 1005. Thus, whatever the state of the data signal at the static logic stage 1005, it is held there during the NextCk pulse such that it can be sampled by the next pipestage at the output node 1010. When the NextCk signal pulse ends by transitioning to a low state, the data signal is again allowed to proceed through the logic chain. In this manner, increased min-delay race protection may be provided.

Figure 13:
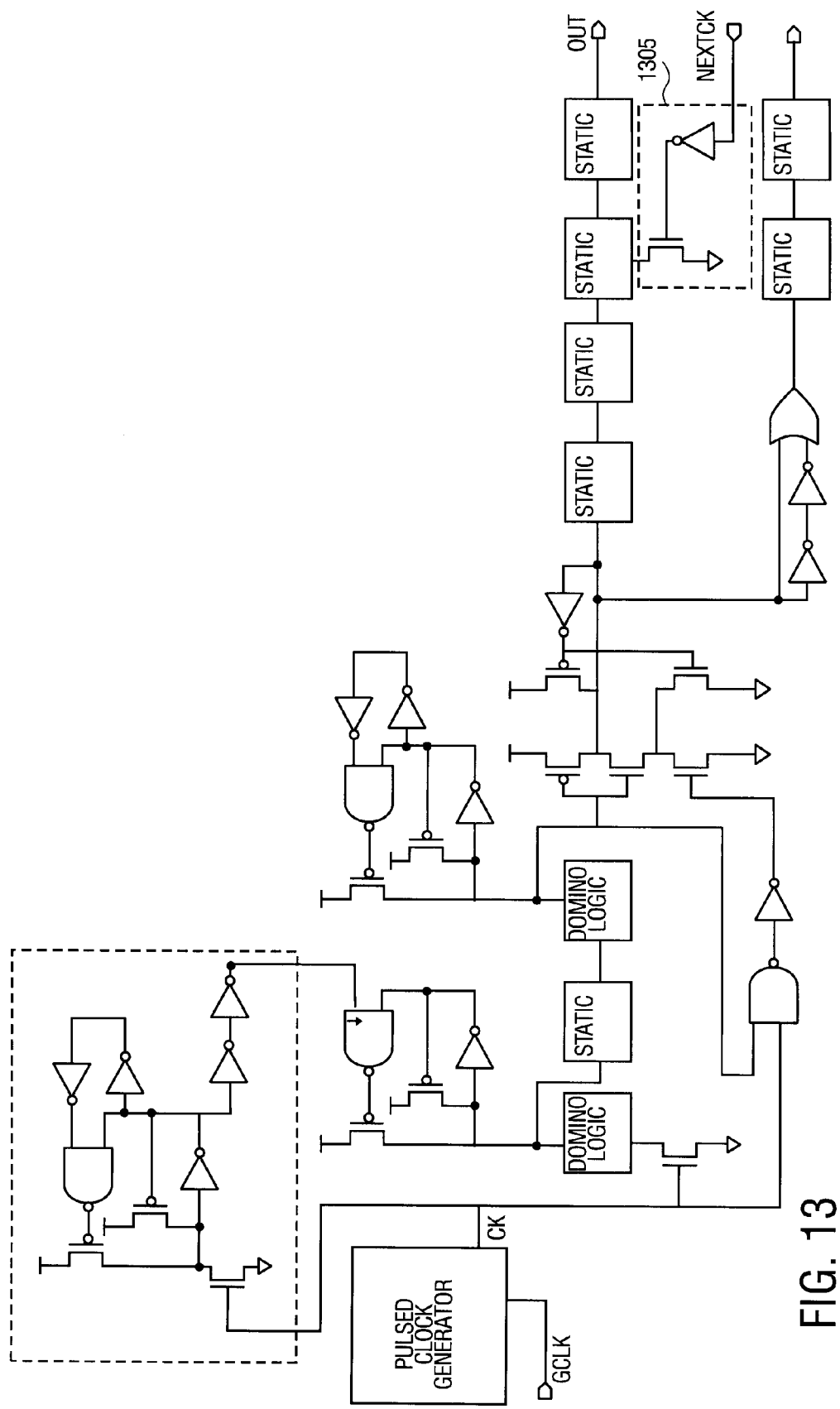
Figure 14:
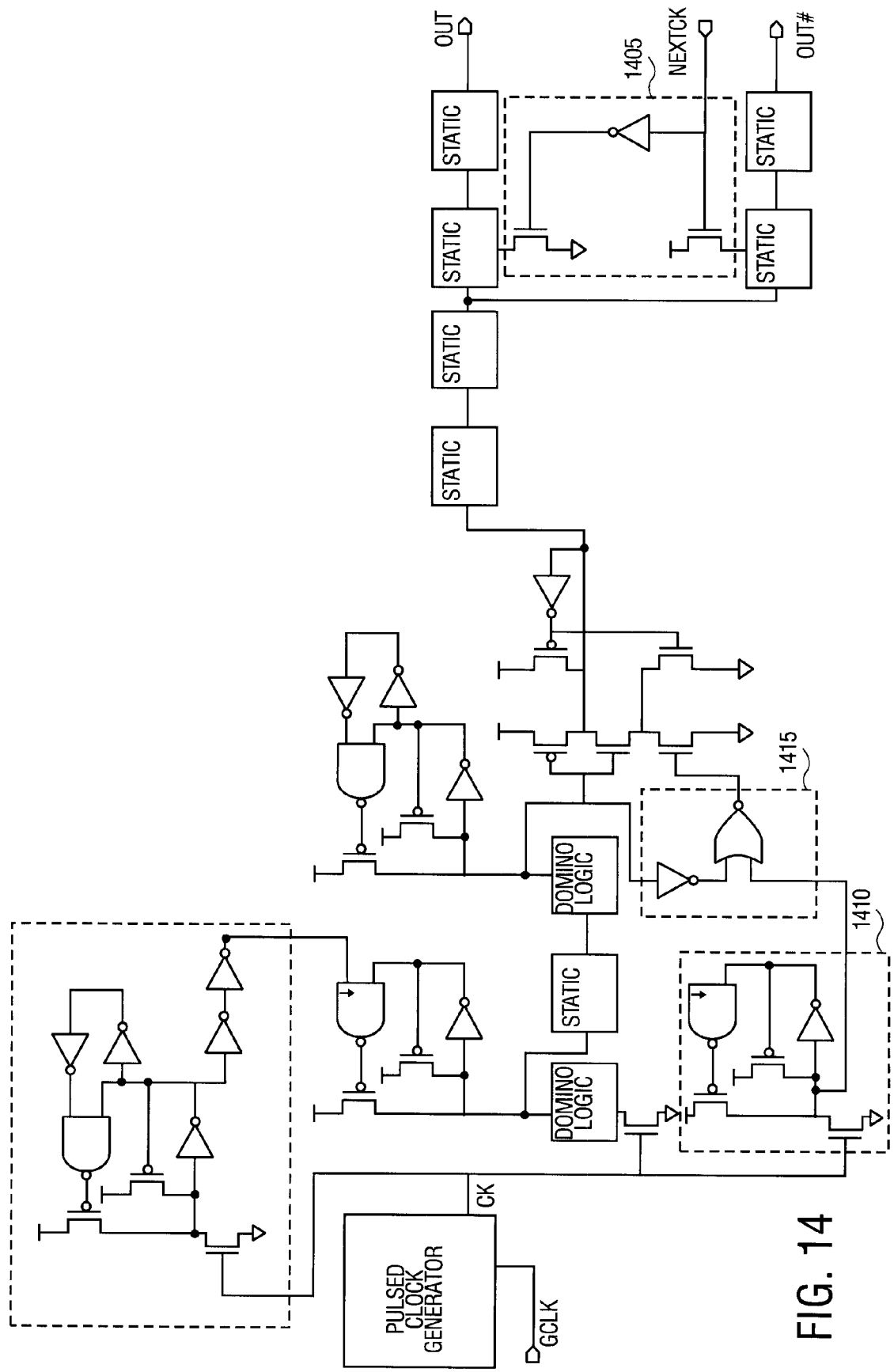

Other exemplary configurations of a redundant latch using different placement, clocking, and/or coupling approaches that may be used for various embodiments are shown in FIGS. 11–14. FIGS. 13–14 show half blocker circuits that may be used to block a transition in one direction. The embodiment of FIG. 14 also includes two clock delay circuits 1410 and 1415 used to delay the Ck signal to the SDL. The clock delay circuit 1415 is also referred to as a latch protection or pulse extender circuit and includes an inverter and a NOR gate. The pulse extender 1415 can be used, for example, to ensure that current data latched by the SDL is not erased as the input domino node is precharged in preparation for the next evaluate while there is an extended reset pulse. In this manner, it may be possible, for example, to insert logic functions into the reset path. This may be particularly useful, for example, where the SDL is placed before the last stage of the pipestage.

Figure 24:
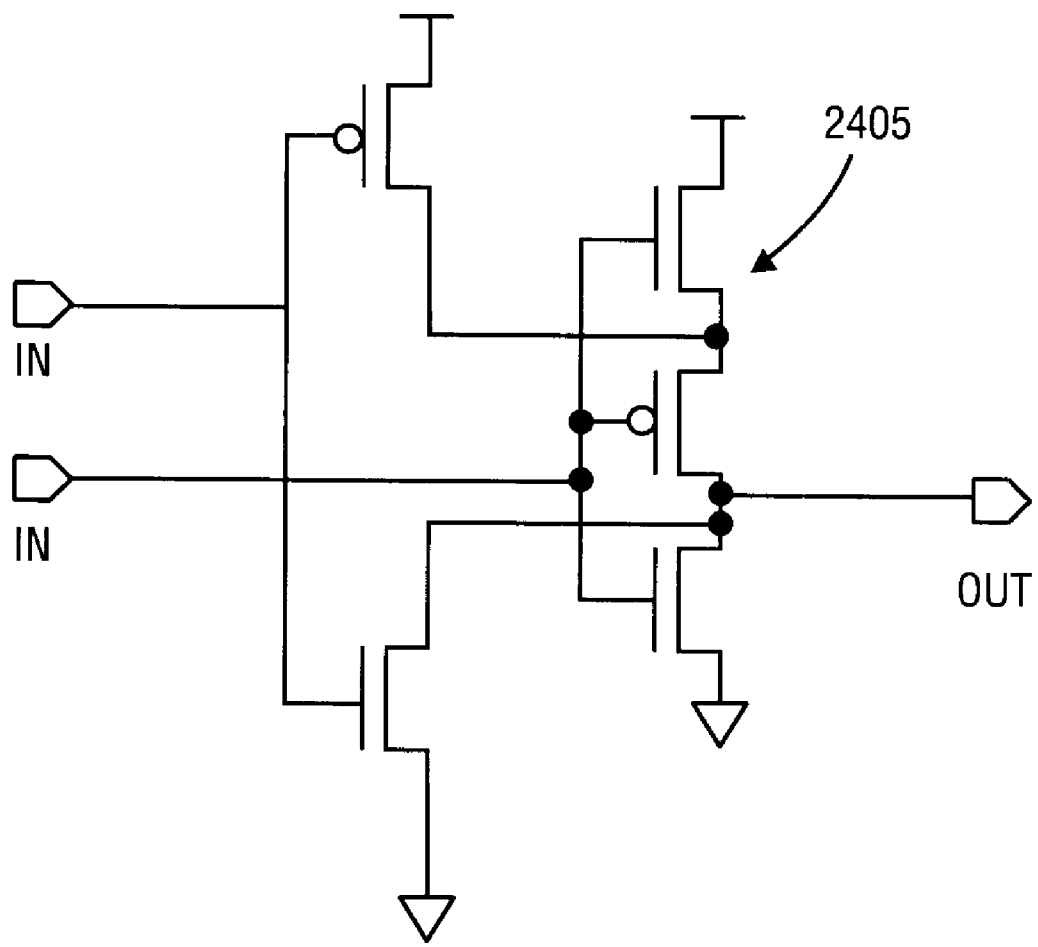
FIG. 24 is a schematic diagram of a NOR gate that may be used in the pulsed circuit topologies of various embodiments.

For one embodiment, the NOR gate is a fast NOR gate implemented in the manner shown in FIG. 24. The fast NOR gate of FIG. 24 includes an additional small n-type device 2405. The n-type device 2405 is sized such that, where the input coupled to the device 2405 is high, the pull-down path prevails. Where both inputs are switched low, however, the small n-type device 2405 assists in pulling the output up such that the output switches more quickly. Because p-type devices switch more slowly than n-type devices, this small n-type device 2405 provides for faster operation of the NOR gate which may help alleviate a speedpath constraint when both p-stack inputs are concurrently switched.

Other clock delay approaches may also be used for other embodiments where desired.

Further details of blockers that may be used in various embodiments are provided in the copending U.S. Patent Application cited above entitled "Pulsed Circuit Topology Including a Pulsed, Domino Flip-Flop" and in copending U.S. patent applications Ser. No. 09/467,214 entitled, "Pulsed Clock Signal Transfer with Dynamic Latching," filed Dec. 20, 1999, and U.S. Pat. No. 6,242,958 to Fletcher entitled, "Master Slave Flip-Flop as a Dynamic Latch," issued Jun. 5, 2001, all of which are assigned to the assignee of the present invention.

The redundant latch and edge shifter circuitry of various embodiments is referred to herein under the general term receiver side circuitry as it is used to interface with a circuit receiving a signal from the pipestage of interest.

For other embodiments, instead of the SDL shown in FIGS. 1 and 4–16, a different type of latch or interface structure may be used. In the embodiment shown in FIG. 17, for example, an inverter and keeper combination 1705 may instead be used. In the embodiments shown in FIGS. 18–20, for example, a reset first latching mechanism is included in each of the exemplary pipestages. Embodiments of a similar reset first latching mechanism are described in a copending U.S. patent application Ser. No. 09/608,638, entitled, "Reset First Latching Mechanism," filed concurrently herewith and assigned to the assignee of the present invention.

Figure 18:
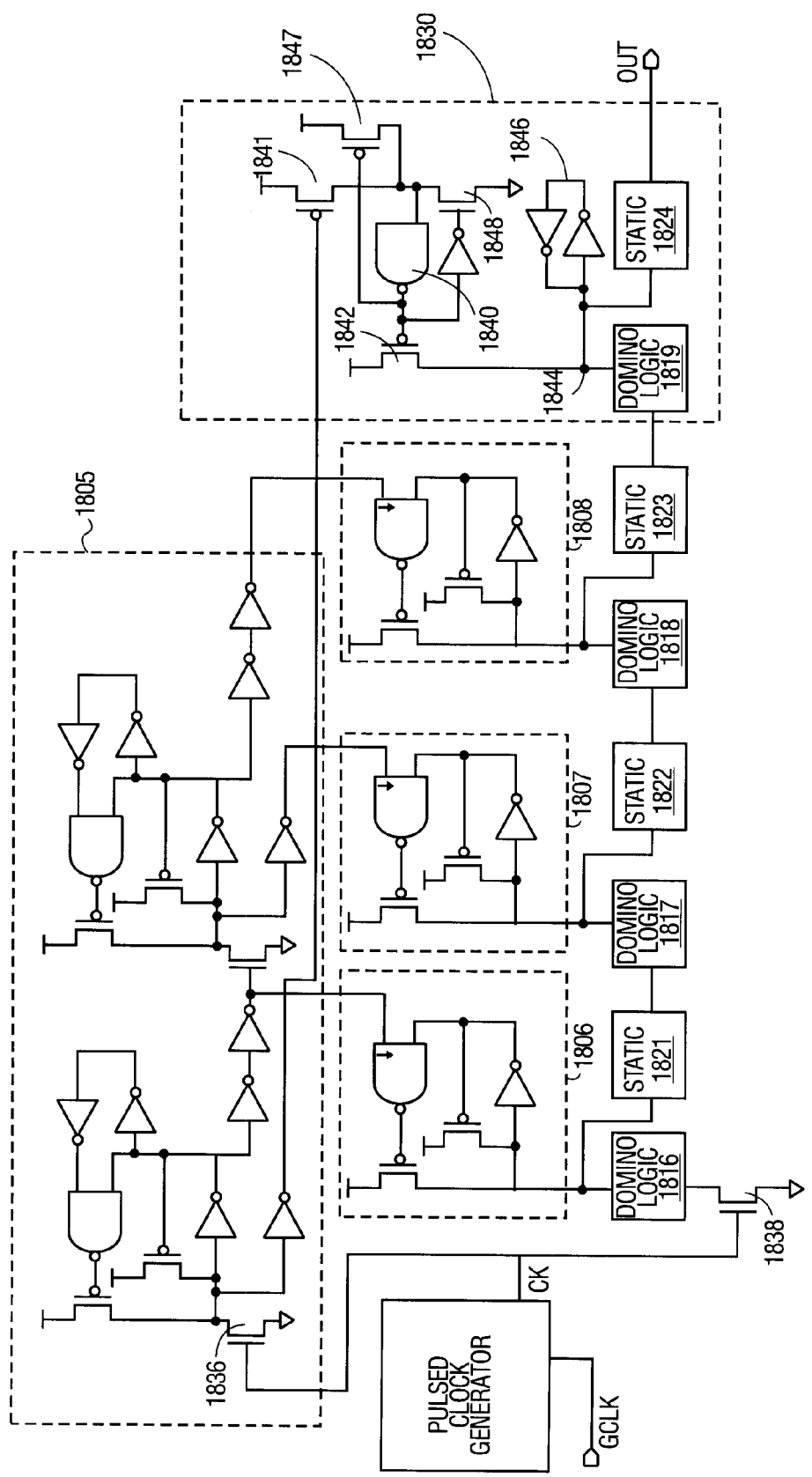
FIGS. 18–20 are schematic diagrams of the pulsed circuit topology of various embodiments using global clock self-timed circuitry and a reset first latching mechanism.

Referring first to FIG. 18, a circuit 1800 includes global reset circuitry 1805 that is similar in configuration and operation to the global reset circuitry 405 of FIG. 4 and self-terminating precharge stages 1806–1808 that are similar in configuration and operation to the self-terminating precharge stages 106–108 of FIG. 1. Also included in the circuit 1800 are domino logic stages 1816–1819, static logic stages 1821–1824 and a reset first latching mechanism 1830. The reset first latching mechanism is so called because it is reset first and then the reset is followed quickly by an evaluate. The reset first latching mechanism 1830 is another example of a latching circuit that may be used in place of the SDL described above. A different number of static, domino and/or self-terminating precharge stages may be included for other embodiments with a corresponding change to the global reset circuitry 1805.

In operation, a rising edge of the clock pulse Ck arrives concurrently at a pull-down device 1836 in the global reset circuitry 1805 and at an evaluate device 1838 coupled to domino logic 1816. Two inversions later, this rising edge causes one input of a NAND gate 1840 to be pulled high. The other input to the NAND gate 1840 was previously pulled high by the device 1841 while the Ck signal was low. An output of the NAND gate 1840 goes low to initiate a precharge pulse three inversions aver the Ck signal rising edge is received at the pull-down device 1836. In response to the reset pulse, a precharge device 1842 is enabled to precharge a domino node 1844.

A latching element 1846, a jam latch in this example, then captures and recycles (or holds) the state of the domino node 1844. For other embodiments, a different type of latching element, such as, for example, an interrupted keeper, may be used in place of the latching element 1846.

The low output of the NAND gate 1840 enables a weak keeper device 1847 and subsequently, a pull-down device 1848. Enabling the pull-down device 1848 causes the reset pulse at the NAND gate 1840 output to be chopped to have approximately a 3-inversion pulse width. The reset pulse is chopped to avoid contention when an evaluate pulse arrives shortly thereafter.

An evaluate pulse is initiated at input(s) to the domino logic 1819 approximately six inversions after the rising edge of the Ck pulse is received at the pull-down device 1838. In this manner, a reset pulse is followed very quickly by an evaluate pulse. If input(s) to the various domino and static stages 1816–1819 are set appropriately, the domino node 1844 then evaluates low 7 inversions after the Ck rising edge is received at the gates of the pull-down devices 1836 and 1838. The state of the domino node 1844 is held by the latching element 1846 for use by subsequent logic.

Figure 19:
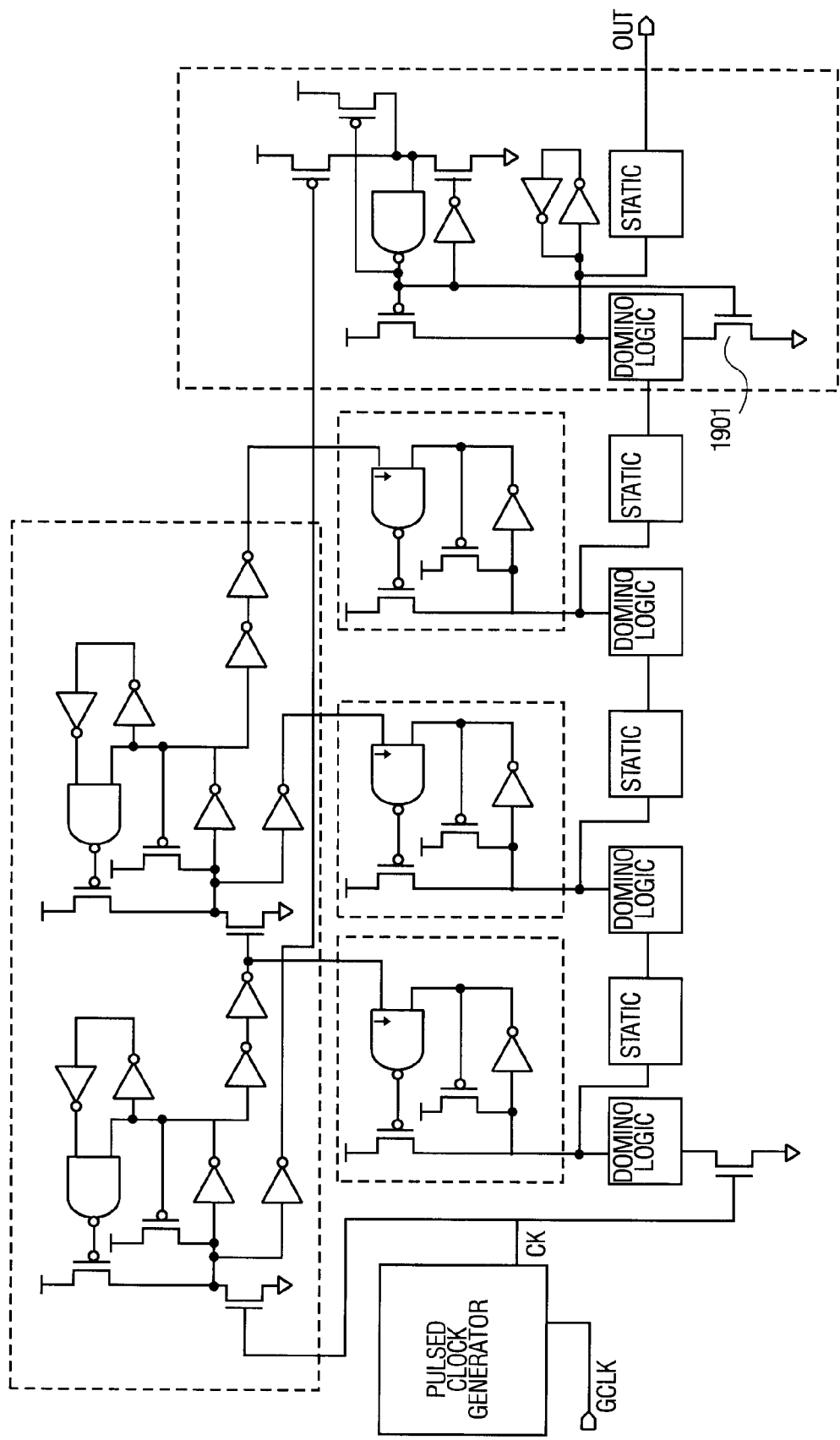

For another embodiment, as shown in FIG. 19, an n-type interrupt device 1901 is added such that an evaluate pulse is not enabled until the reset input pulse goes high. This further prevents concurrent enabling of both pull-up and pull-down paths.

Figure 20:
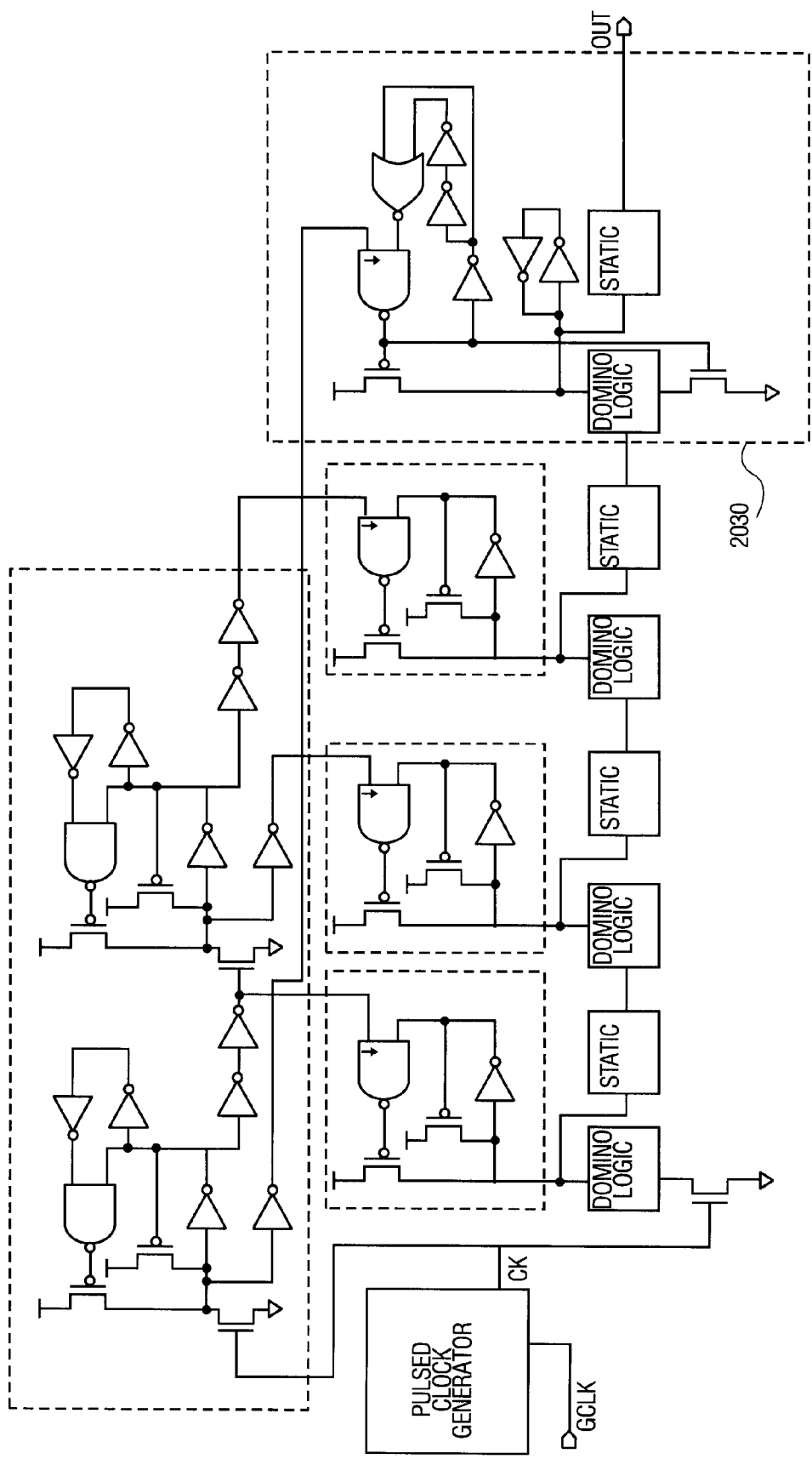

Yet another variation is shown in the embodiment of FIG. 20. For the first reset latching mechanism 2030 of FIG. 20, the NAND gate has been replaced with a NAND gate with one weak pull-up as shown. Further, the pulse chopper circuitry including the NAND gate has been reconfigured as shown. The first reset latching mechanism 2030 of FIG. 20 also provides a three inversion reset pulse which is quickly followed by an evaluate pulse.

For other embodiments, the reset, pulsed clock and/or evaluate pulses may be different widths. Reset first latching mechanism circuits similar to those of FIGS. 18–20 as well as those that may be used for other embodiments are described in more detail in a copending U.S. patent application Ser. No. 09/608,638, entitled, "Reset First Latching Mechanism," filed concurrently herewith and assigned to the assignee of the present invention.

Figure 21:
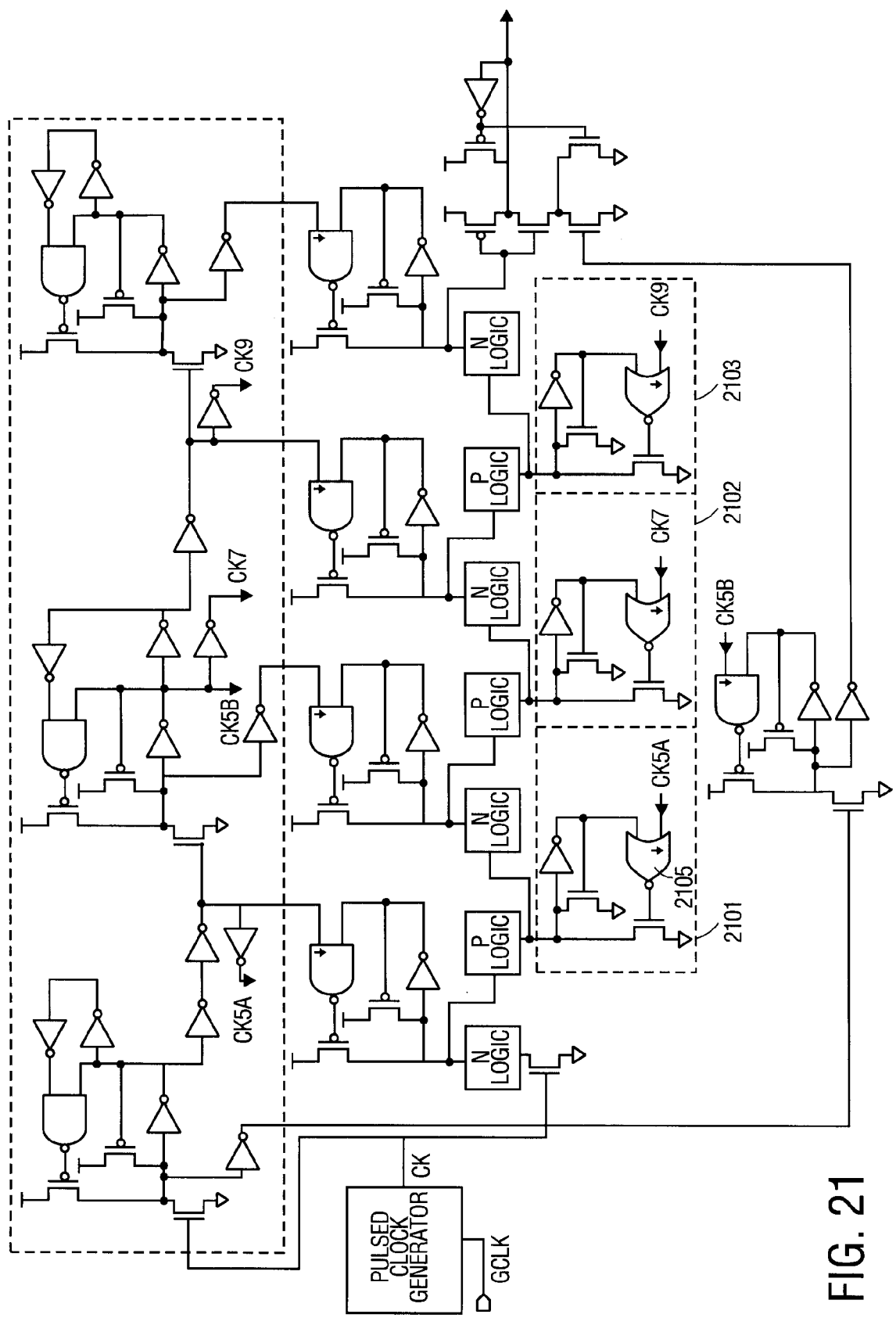
FIGS. 21–22 are schematic diagrams of the pulsed circuit topology of other embodiments that includes global clock self-timed circuitry with self-terminating precharge circuitry.

For other embodiments, it will be appreciated that complementary logic may be used for some or all of the domino stages and/or that one or more of the static stages may be replaced by domino logic. For the circuit topology shown in FIG. 1, for example, each of the static stages 121–123 may be replaced by p-type domino logic as shown in FIG. 21. This combination of n-type domino logic followed by p-type domino logic may be referred to as zipper domino.

For the circuit of FIG. 21, complementary self-terminating precharge circuits 2101–2103 are included for corresponding p-type domino logic stages. (In FIG. 21, the solid darkened arrows are coupled at corresponding darkened arrows as indicated by corresponding references. For example, the output of the inverter including the darkened arrow identified as CK5A is coupled to the input to the NOR gate 2105 identified with CK5A.) The self-terminating precharge circuits 2101–2103 operate in a similar manner to their complementary counterparts described above, except that all signal edges have a reversed polarity. The self-terminating precharge circuits 2101–2103 each include a NOR gate with one weak pull-down (such as the NOR gate 2105) such that a reset pulse cannot be terminated in the time period of interest by a transition of the global reset circuitry alone.

For the embodiment shown in FIG. 21, p-type domino logic may be included at every even stage of the pipestage except for the output stage. For this stage, an SDL is used to hold the output state. For other embodiments, it may be undesirable to use p-type domino logic at the output due to noise considerations.

Figure 22:
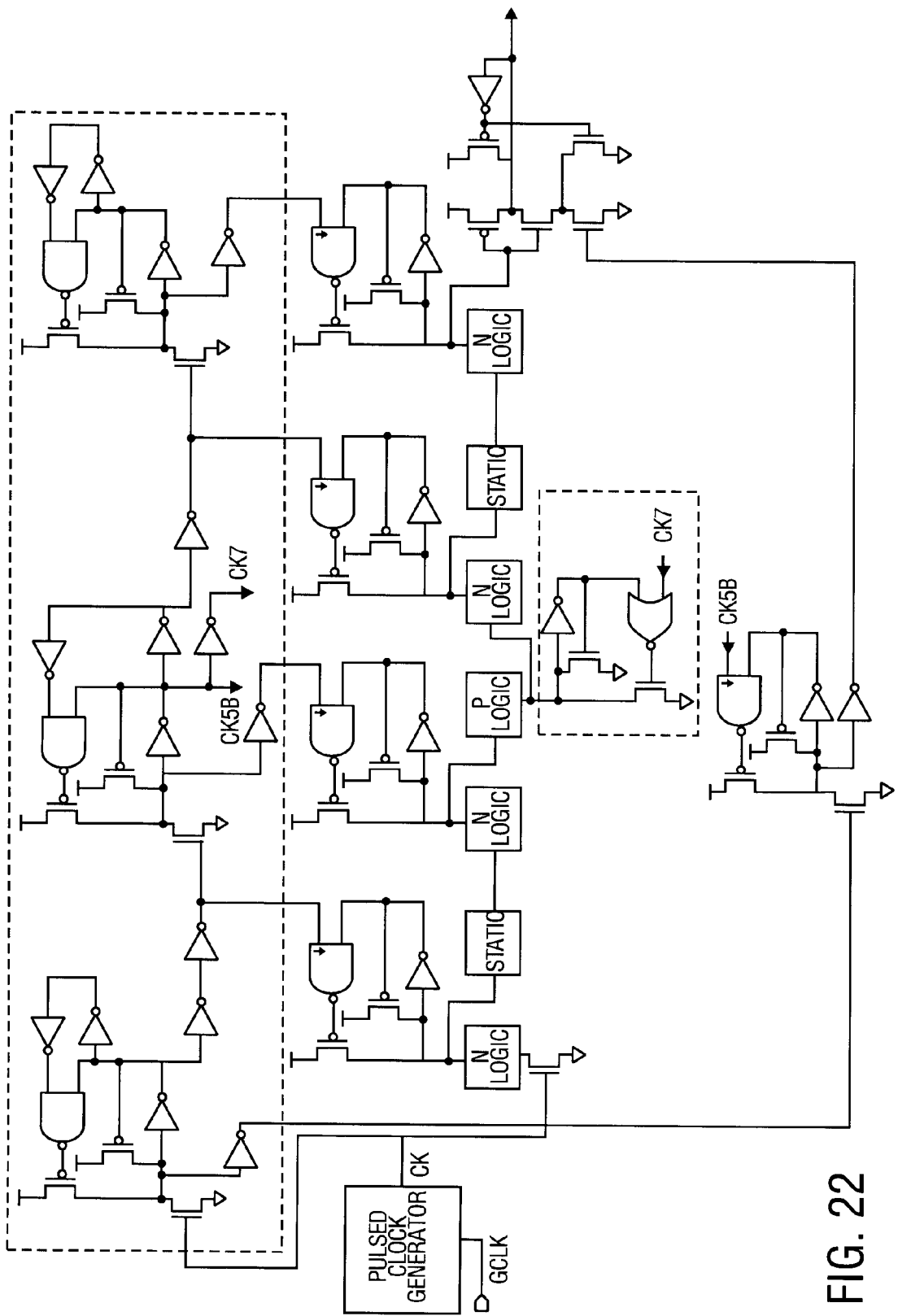

As shown in FIG. 22, for another embodiment, only one or more of the static stages may be replaced by p-type domino logic.

Figure 23:
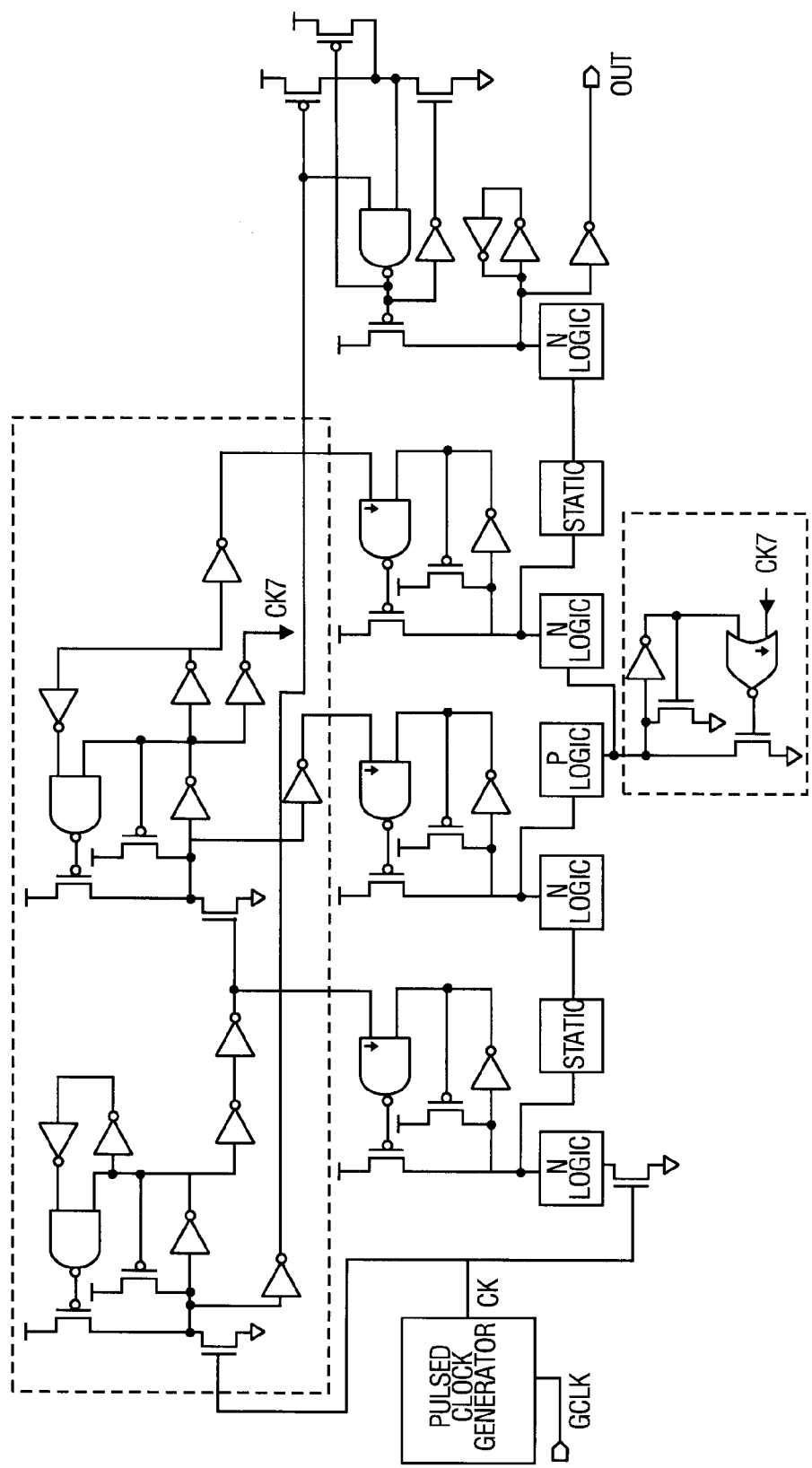
FIG. 23 is a schematic diagram of the pulsed circuit topology of another embodiment using global clock self-timed circuitry and a reset first latching mechanism.

FIG. 23 shows another embodiment in which one of the static logic stages of the topology shown in FIG. 18 is replaced by p-type domino logic. For other embodiments, a different number of static stages may be replaced by p-type domino logic.

Further, for other embodiments, one or more of the n-type domino logic stages may be replaced by p-type domino logic and/or a different number of logic stages may be used. It will further be appreciated that corresponding logic and pulse widths and frequencies of various signals may differ from those described above.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
   a global clock self-timed circuit responsive to a clock signal to initiate a precharge pulse in response to which a domino node is precharged, the global clock self-timed circuit including multiple stages, each stage being associated with one or more domino stages; and
   a self-terminating precharge circuit coupled to the global clock self-timed circuit and responsive to a voltage level at the domino node to terminate the precharge pulse after the domino node has been precharged.

2. The apparatus of claim 1 wherein the self-terminating precharge circuit includes a logic gate having a first device that is weaker than a second device of the same type, the first device being coupled to receive a first input, the second device being coupled to receive a second input.

3. The apparatus of claim 1 wherein a self-terminating precharge circuit is coupled to each of the multiple stages of the global clock self-timed circuit.

4. The apparatus of claim 1 wherein the one or more domino stages are alternated with static stages.

5. The apparatus of claim 1 wherein one or more of the multiple stages of the global clock self-timed circuit initiates precharge pulses in response to which domino nodes at outputs of both n-type and p-type domino stages are precharged.

6. The apparatus of claim 1 wherein the clock signal is a pulsed clock signal, the pulsed clock signal having a frequency higher than that of a second clock signal used to clock other circuitry in an integrated circuit that includes the global clock self-timed circuit.

7. The apparatus of claim 6 wherein the reset pulse is narrower than a clock pulse of the pulsed clock signal.

8. The apparatus of claim 7 wherein the reset pulse and an evaluate pulse occur within eight unit delays (inversions).

9. A circuit comprising:
   a plurality of logic stages including at least one domino logic stage;
   a global clock self-timed circuit coupled to the at least one domino logic stage, the global clock self-timed circuit being responsive to a clock signal to initiate a reset pulse in response to which a domino node coupled to the at least one domino logic stage is precharged, the global clock self-timed circuit including multiple stages, each stage being associated with one or more domino stages; and
   a self-terminating precharge circuit coupled to the at least one domino logic stage, the self-terminating precharge circuit being responsive to a voltage level at the domino node to terminate the reset pulse after the domino node has been precharged.

10. The circuit of claim 9 wherein the plurality of logic stages includes at least one static logic stage, the static logic stage comprising ratioed logic.

11. The circuit of claim 10 further comprising:
a latching circuit coupled to the plurality of logic stages to latch data indicated by a data signal received from at least one of the plurality of logic stages.

12. The circuit of claim 11 wherein the latching circuit comprises a set-dominant latch.

13. The circuit of claim 11 wherein the latching circuit comprises a reset first latching mechanism.

14. The circuit of claim 9 further comprising receiver side circuitry to interface the circuit with a second circuit that receives a data signal from the circuit.

15. The circuit of claim 14 wherein the receiver side circuitry comprises an edge shifter circuit.

16. The circuit of claim 14 wherein the receiver side circuitry comprises a redundant latch circuit.

17. The circuit of claim 9 wherein the plurality of logic stages includes domino logic stages at regular intervals to act as restoring stages.

18. The circuit of claim 17 wherein the domino logic stages alternate between p-type and n-type domino logic stages.

19. A method comprising:
globally initiating a first reset pulse in response to receiving a clock signal at a global clock self-timed circuit including multiple stages, each of the multiple stages to provide a reset pulse to one or more domino stages;
precharging a domino node in response to the first reset pulse; and
self-terminating the first reset pulse in response to a voltage level at the domino node after the domino node has been precharged.

20. The method of claim 19 wherein
globally initiating a first reset pulse in response to a clock signal includes globally initiating a first reset pulse in response to a pulsed clock signal,
the method further comprising
chopping the first reset pulse to have a width less than a pulse width of the pulsed clock signal.

21. The method of claim 20 further comprising:
evaluating domino logic at the domino node in response to an evaluate pulse at an input to the domino logic.

22. The method of claim 20 further comprising:
restoring a pulsed signal at intervals along a pipestage to reduce pulse evaporation.

23. The method of claim 21 further comprising
latching data indicated at the domino node in response to the evaluate pulse; and
providing a static output signal corresponding to the data indicated at the domino node.

24. The method of claim 21 further comprising:
controlling timing of the reset and evaluate pulses such that both pulses occur within a cycle of the pulsed clock signal, the cycle of the pulsed clock signal being approximately equivalent to ten inversions or less.

25. The method of claim 21 further comprising:
redundantly latching data indicated at the domino node.

26. The method of claim 23 further comprising:
shifting a transition in one direction of the static output signal; and
providing a complementary static output signal.

27. The method of claim 23 wherein
latching data includes first resetting the domino node and then evaluating the domino node.

* * * * *